US012757559B2

(12) United States Patent
Cha et al.

(10) Patent No.: US 12,757,559 B2
(45) Date of Patent: Oct. 6, 2026

(54) UNIT PIXEL HAVING LIGHT EMITTING DEVICE AND DISPLAYING APPARATUS

(71) Applicant: SEOUL VIOSYS CO., LTD., Ansan-si (KR)

(72) Inventors: Namgoo Cha, Ansan-si (KR); Sangmin Kim, Ansan-si (KR); Jung Hwan Ahn, Ansan-si (KR); Jae Hee Lim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/890,547

(22) Filed: Sep. 19, 2024

(65) Prior Publication Data

US 2025/0015232 A1 Jan. 9, 2025

Related U.S. Application Data

(63) Continuation of application No. 18/535,178, filed on Dec. 11, 2023, now Pat. No. 12,113,151, which is a continuation of application No. 17/168,958, filed on Feb. 5, 2021, now Pat. No. 11,843,077.

(60) Provisional application No. 63/015,191, filed on Apr. 24, 2020, provisional application No. 62/972,981, filed on Feb. 11, 2020.

(51) Int. Cl.

| | |
|---|---|
| ***H10H 29/855*** | (2025.01) |
| ***H10H 20/82*** | (2025.01) |
| ***H10H 20/855*** | (2025.01) |
| ***H10H 29/14*** | (2025.01) |

(Continued)

(52) U.S. Cl.
CPC ........ *H10H 29/855* (2025.01); *H10H 20/855* (2025.01); *H10H 29/142* (2025.01); *H10H 29/8508* (2025.01); *H10H 20/82* (2025.01); *H10H 29/882* (2025.01)

(58) Field of Classification Search
CPC .. H10H 29/142; H10H 29/20; H10H 29/8508; H10H 29/855; H10H 29/882
See application file for complete search history.

(56) References Cited

U.S. PATENT DOCUMENTS 11,843,077 B2 * 12/2023 Cha .................... H10H 20/831
2006/0009133 A1 1/2006 Hashimoto et al.
(Continued)

FOREIGN PATENT DOCUMENTS

CN 110010636 A 7/2019
CN 110121771 A 8/2019
(Continued)

OTHER PUBLICATIONS

Office Action of the related corresponding Korean Application No. 10-2022-7024567, dated Jan. 16, 2025.
(Continued)

*Primary Examiner* — Mariceli Santiago
(74) *Attorney, Agent, or Firm* — Ashurst Perkins Coie US LLP

(57) ABSTRACT

A unit pixel includes a transparent substrate, a plurality of light emitting devices arranged on the transparent substrate, and an optical layer disposed between the light emitting devices and the transparent substrate and transmitting light emitted from the light emitting devices. The transparent substrate has a concavo-convex pattern on a surface facing the light emitting devices.

20 Claims, 19 Drawing Sheets

(51) Int. Cl.
*H10H 29/80* (2025.01)
*H10H 29/85* (2025.01)

(56) References Cited

U.S. PATENT DOCUMENTS

| | | | | |
|---|---|---|---|---|
| 2009/0127575 | A1 | 5/2009 | Horng et al. | |
| 2012/0080692 | A1* | 4/2012 | Ohtorii | H10H 20/84 257/E33.059 |
| 2012/0161166 | A1* | 6/2012 | Yamazaki | H10K 59/84 257/40 |
| 2017/0263828 | A1 | 9/2017 | Mao et al. | |
| 2018/0350872 | A1 | 12/2018 | Choi et al. | |
| 2019/0243149 | A1 | 8/2019 | Iguchi | |
| 2021/0249564 | A1 | 8/2021 | Cha et al. | |
| 2024/0154067 | A1 | 5/2024 | Cha et al. | |

FOREIGN PATENT DOCUMENTS

| | | | |
|---|---|---|---|
| CN | 110265521 | A | 9/2019 |
| EP | 3506353 | | 4/2018 |
| EP | 3506353 | A2 | 7/2019 |
| JP | 2010129184 | A | 6/2010 |
| JP | 2012078720 | A | 4/2012 |
| JP | 2014137582 | A | 7/2014 |
| KR | 20110115795 | A | 10/2011 |
| KR | 20130051206 | A | 5/2013 |
| KR | 1020150131642 | A | 11/2015 |
| KR | 1020160120050 | A | 10/2016 |
| KR | 20160141362 | A | 12/2016 |
| KR | 1020190010988 | A | 2/2019 |
| KR | 1020190069869 | A | 6/2019 |
| WO | 2020025054 | A1 | 2/2020 |

OTHER PUBLICATIONS

International Search Report for International Application No. PCT/KR2021/001715, mailed May 26, 2021, English Translation, 2 pages.

European Search Report from corresponding European U.S. Appl. No. 21/754,192, dated Feb. 12, 2024.

Office Action from related corresponding Japanese Patent Application No. 2022-548129 dated Aug. 13, 2024.

Office Action from the related corresponding Chinese Application No. 202180014127.7, dated Jul. 7, 2025.

Office Action from related corresponding Korean Application No. 10-2022-7024567, dated Sep. 2, 2025. (6 pages).

* cited by examiner

【FIG. 1】
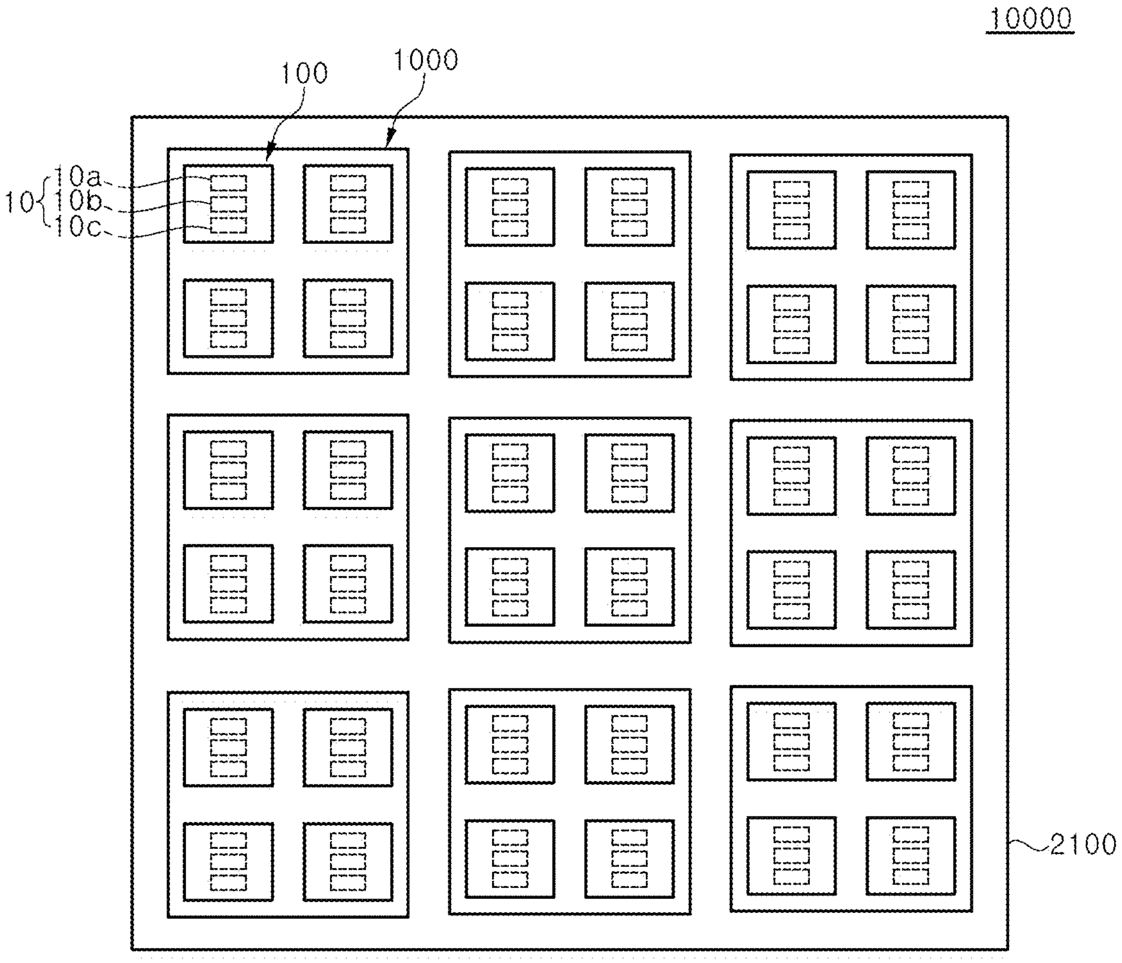

【FIG. 2A】
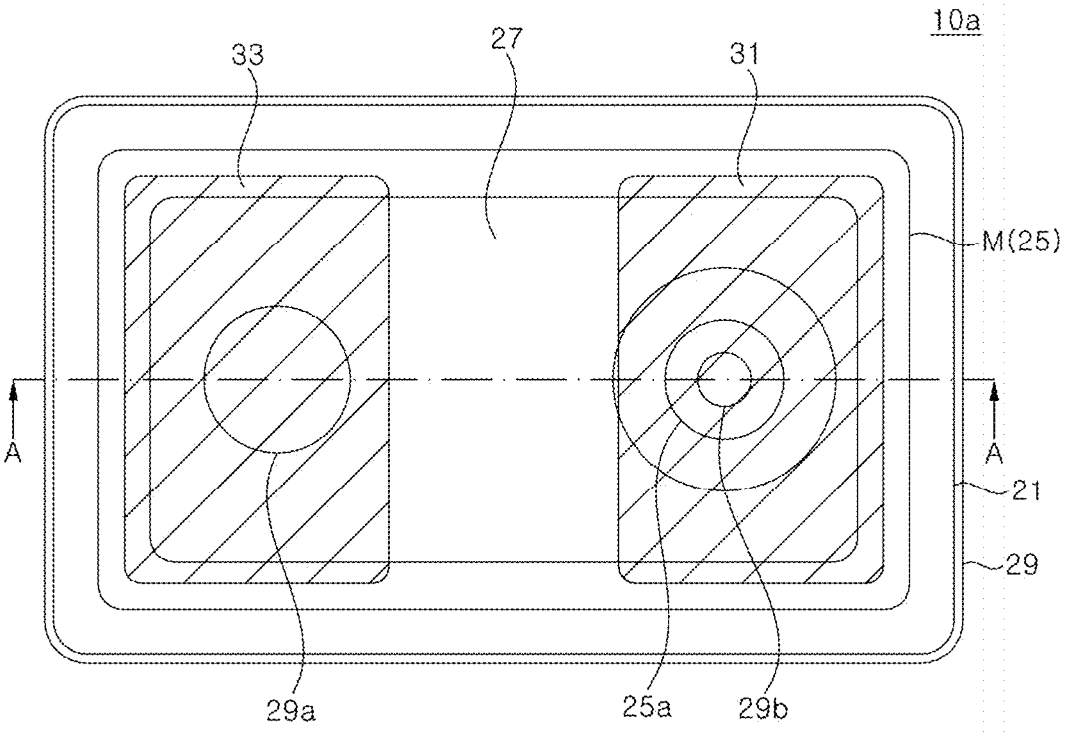
【FIG. 2B】
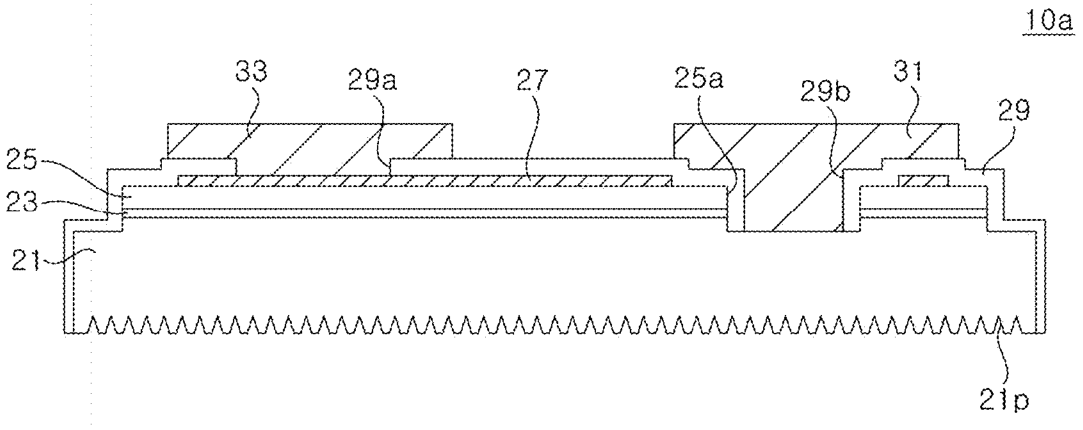

【FIG. 3A】
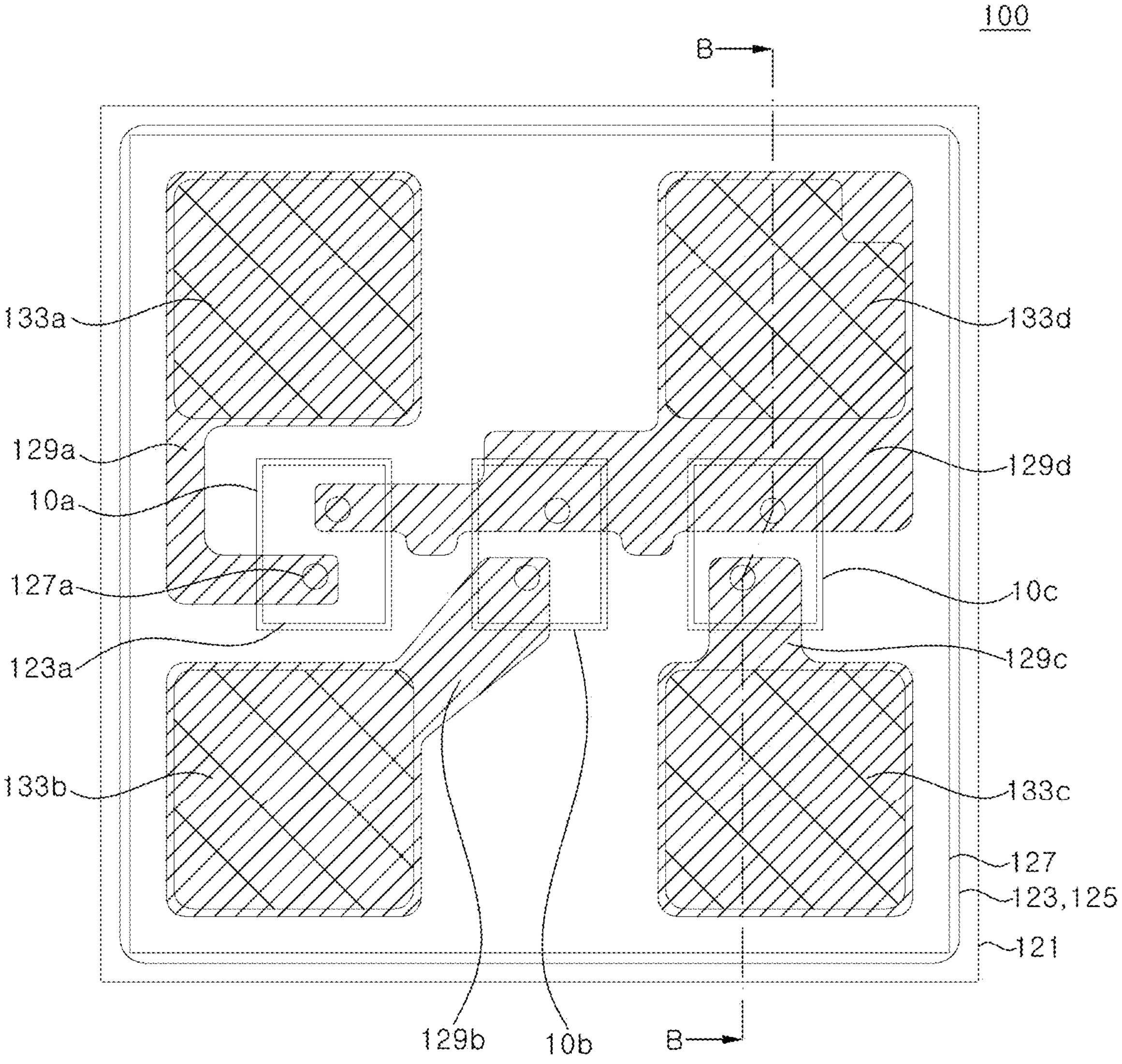

【FIG. 3B】
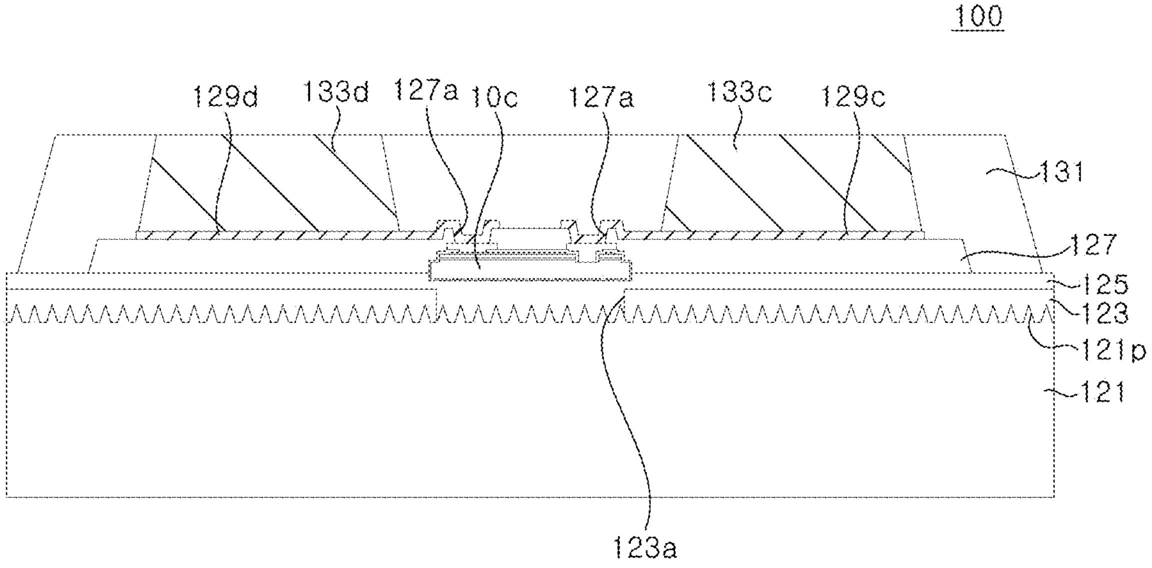

【FIG. 4A】
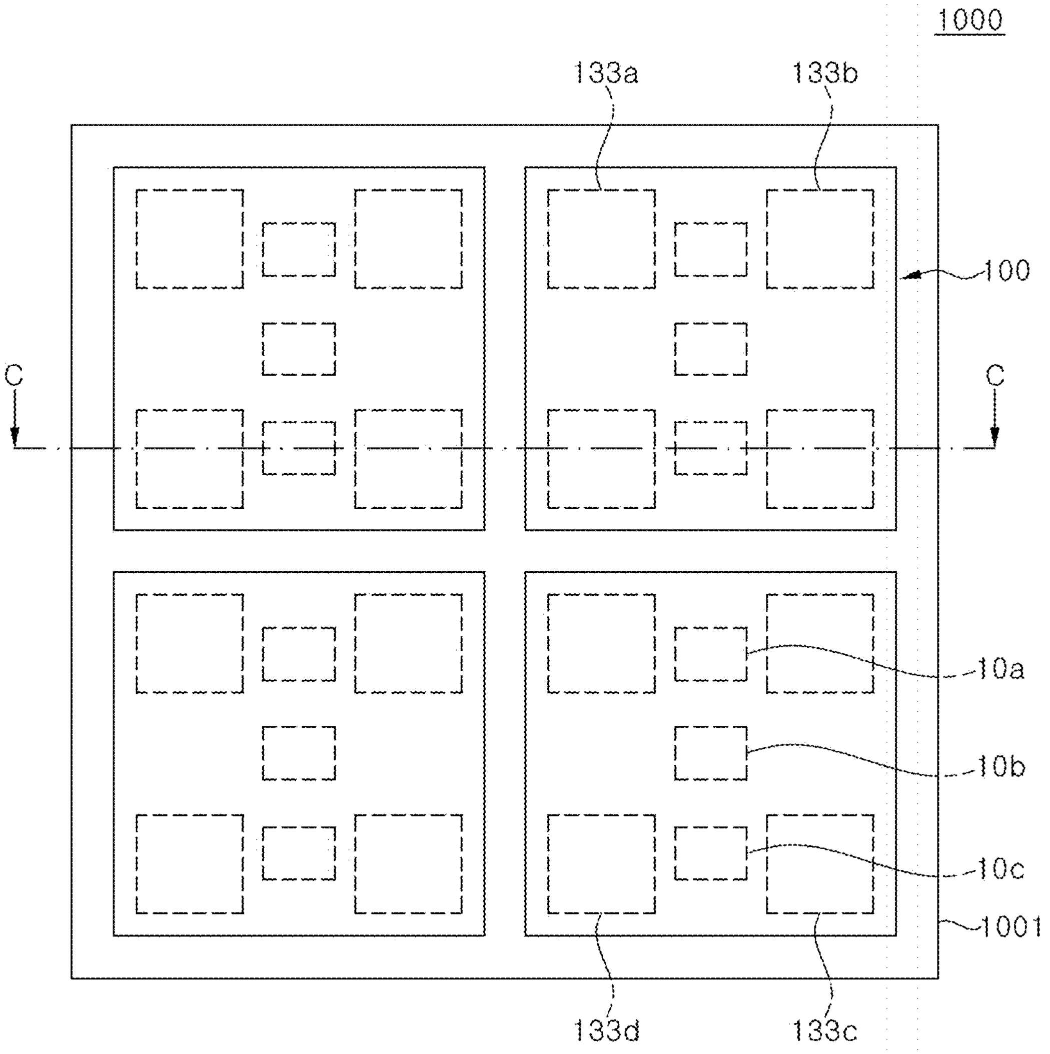

【FIG. 4B】
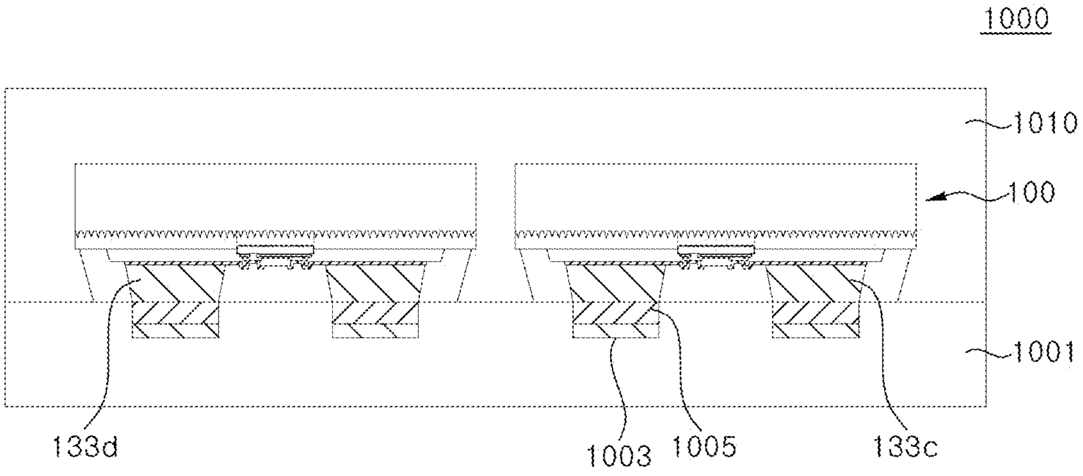
【FIG. 4C】
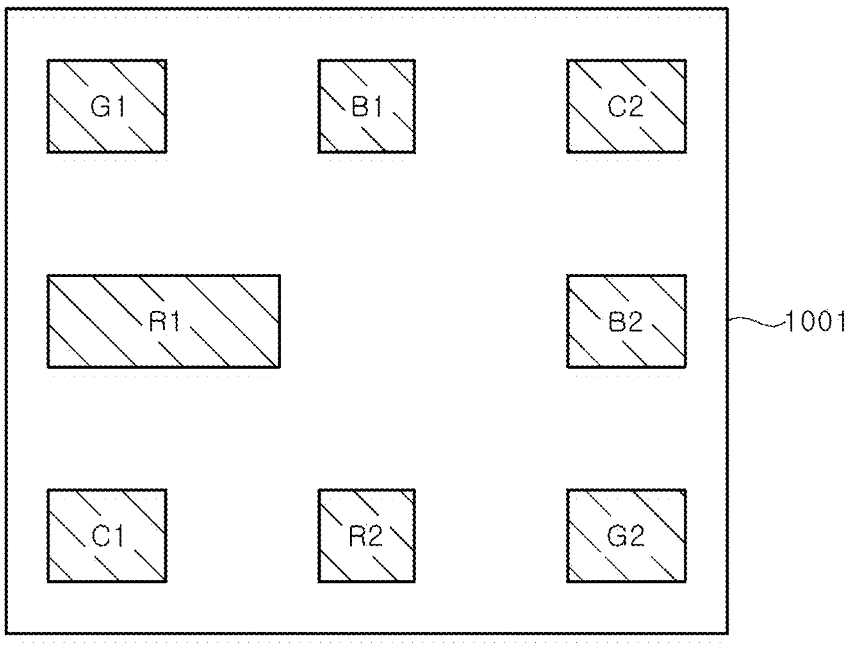

【FIG. 4D】
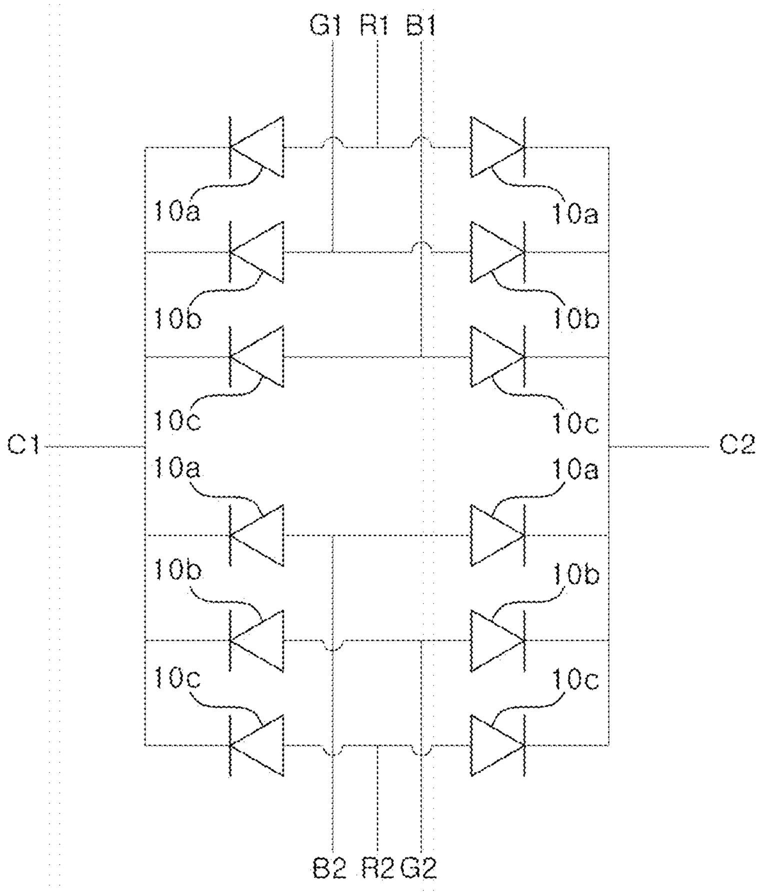

【FIG. 4E】
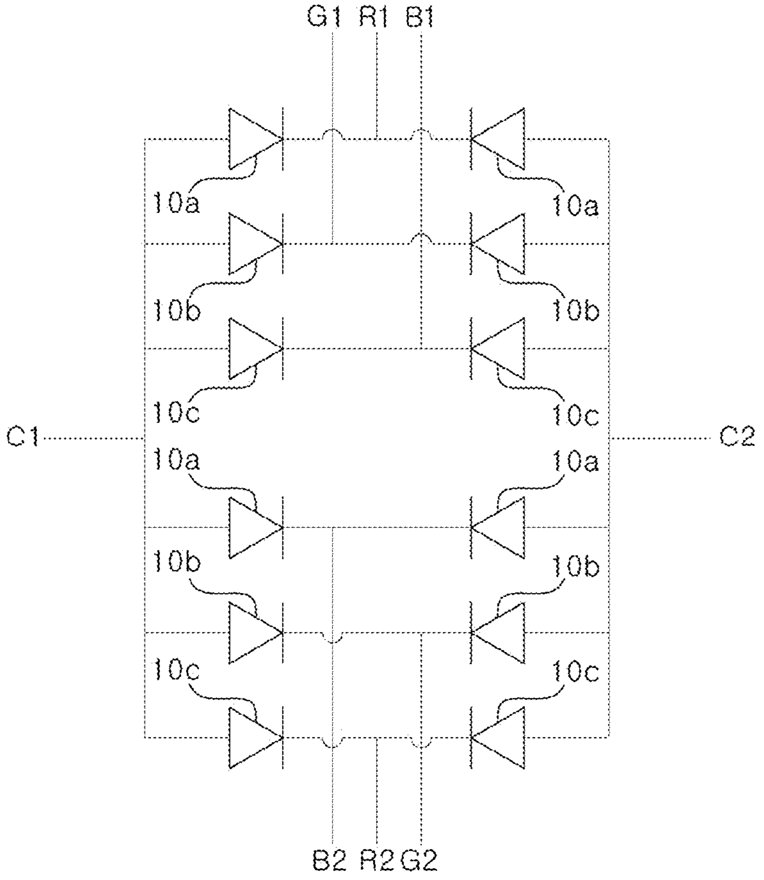

【FIG. 5A】
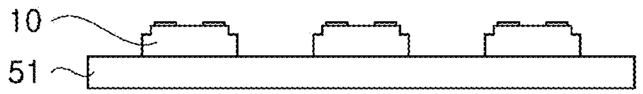
【FIG. 5B】
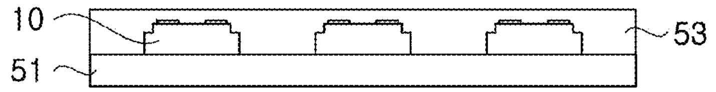
【FIG. 5C】
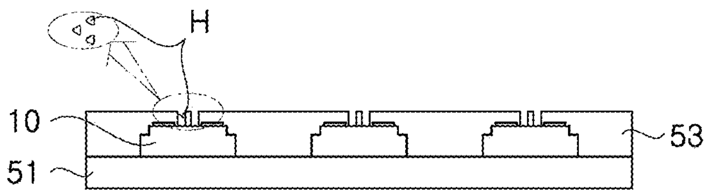
【FIG. 5D】
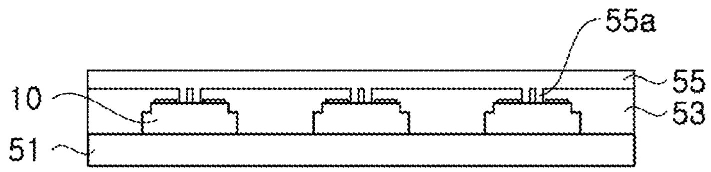
【FIG. 5E】
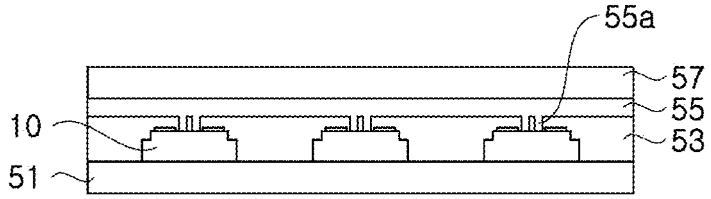
【FIG. 5F】
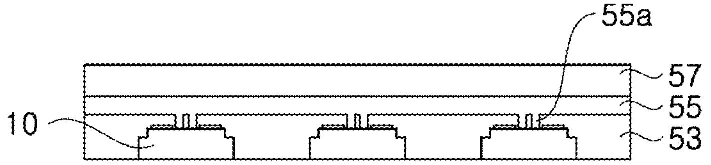

【FIG. 5G】
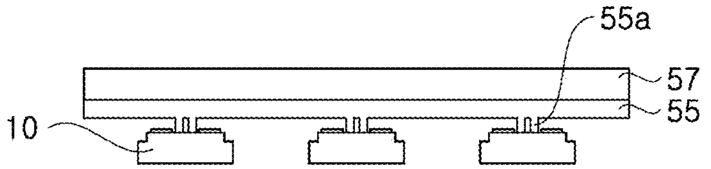
【FIG. 5H】
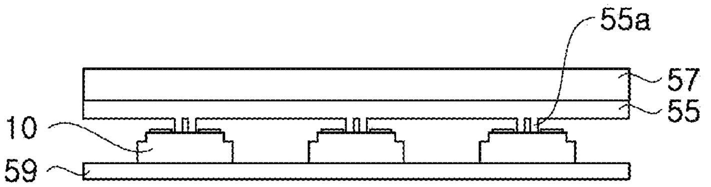
【FIG. 5I】
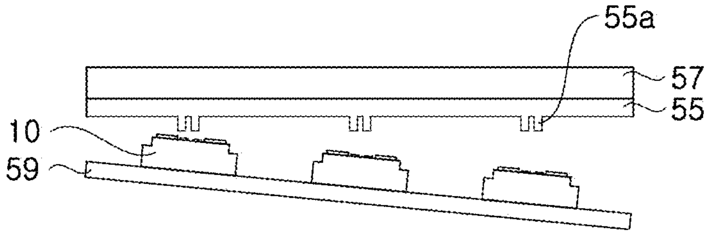
【FIG. 5J】
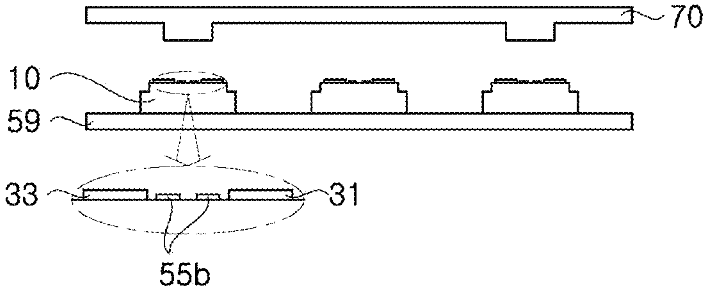
【FIG.5K】
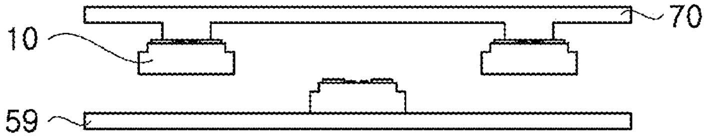

【FIG. 6A】
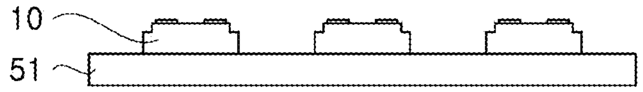
【FIG. 6B】
【FIG. 6C】
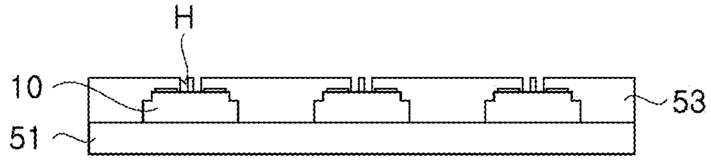
【FIG. 6D】
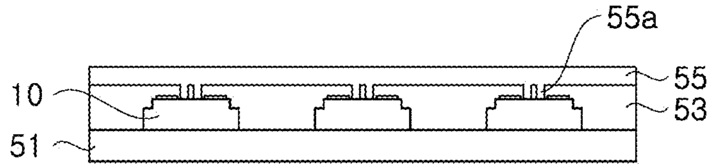
【FIG. 6E】
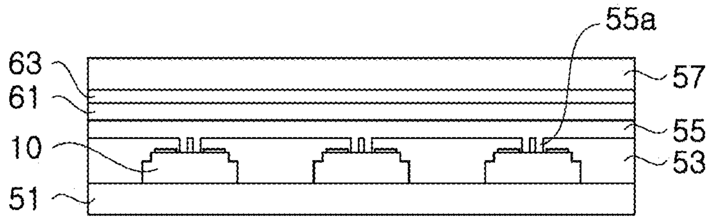
【FIG. 6F】
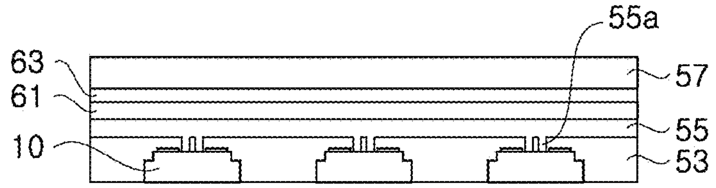

【FIG. 6G】
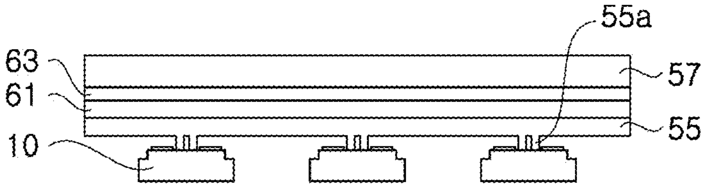
【FIG. 6H】
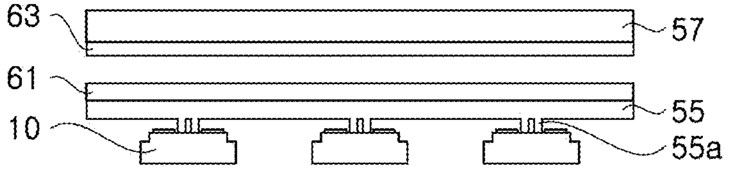
【FIG. 6I】
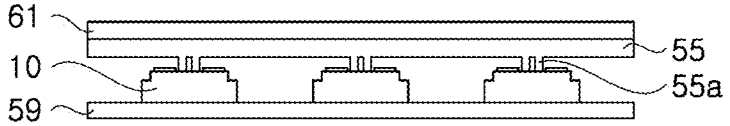
【FIG. 6J】
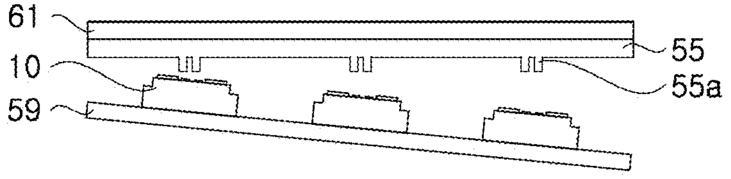
【FIG. 6K】
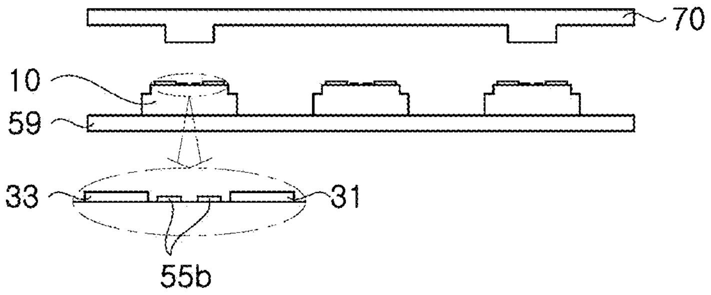

【FIG. 6L】
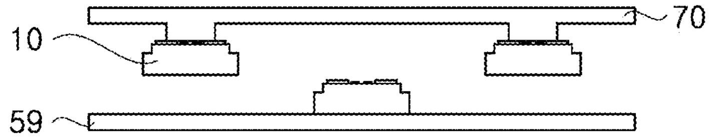
【FIG. 7A】
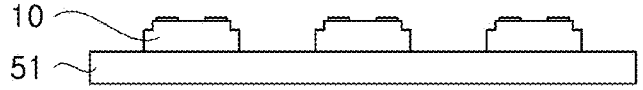
【FIG. 7B】
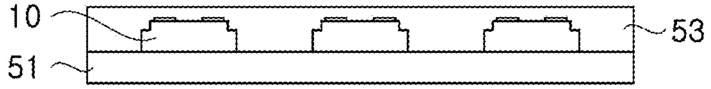
【FIG. 7C】
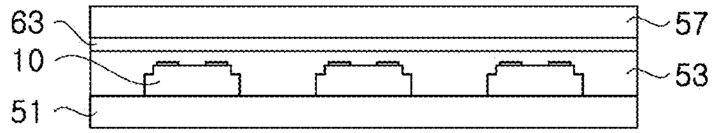
【FIG. 7D】
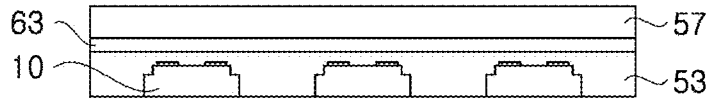
【FIG. 7E】
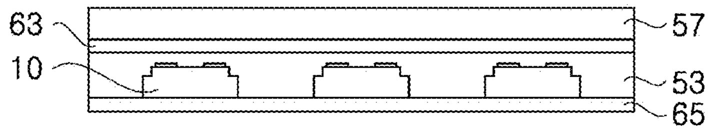

【FIG. 7F】
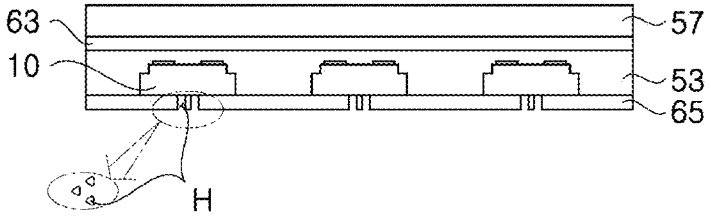
【FIG. 7G】
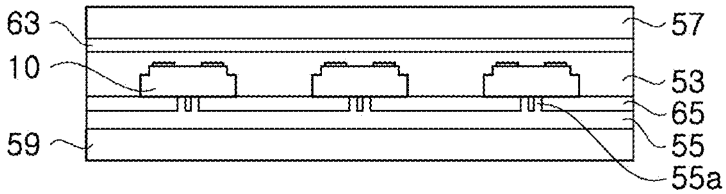
【FIG. 7H】
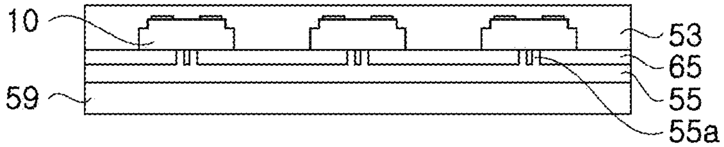
【FIG. 7I】
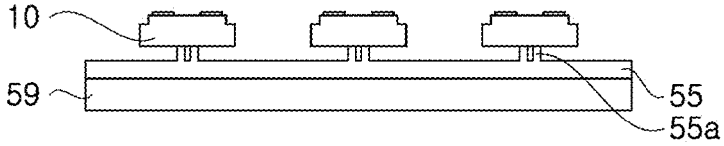
【FIG. 7J】
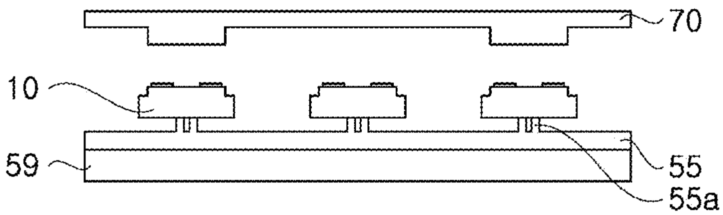

【FIG. 7K】
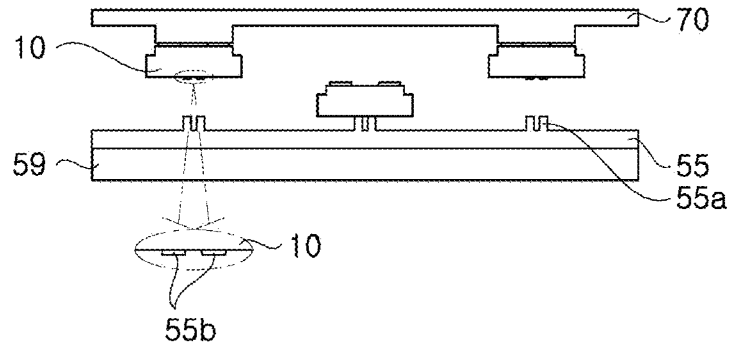
【FIG. 8】
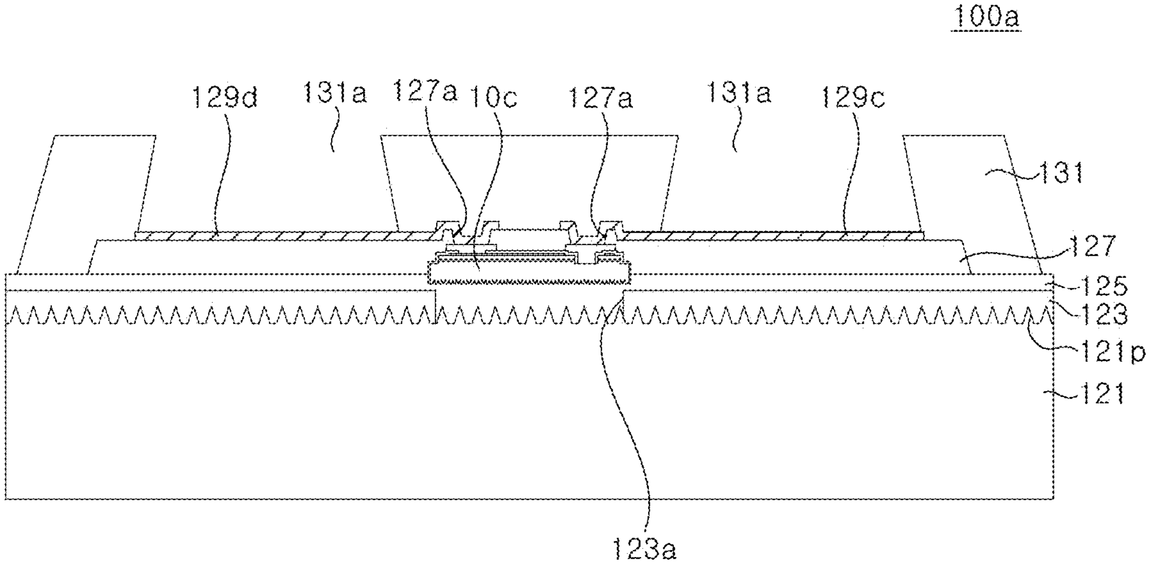
【FIG. 9】
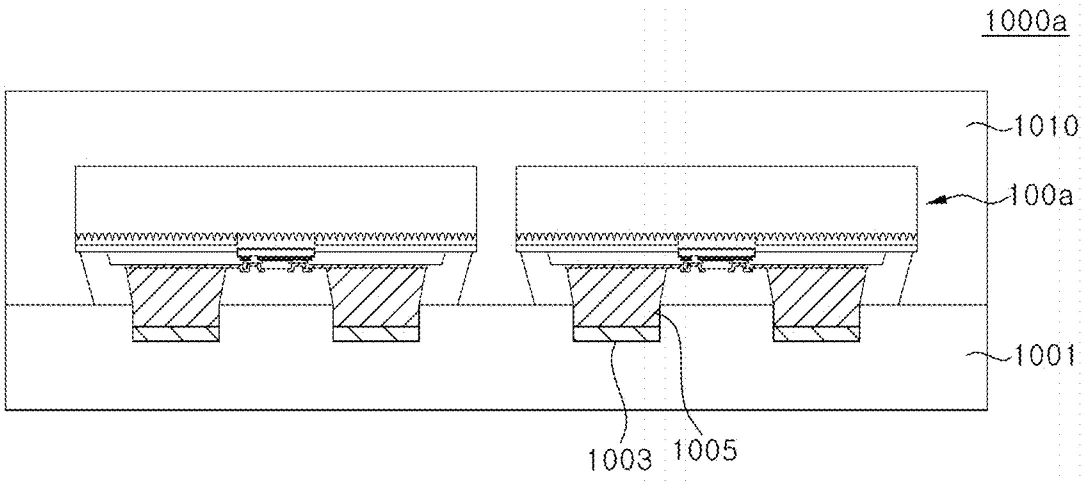

【FIG. 10】
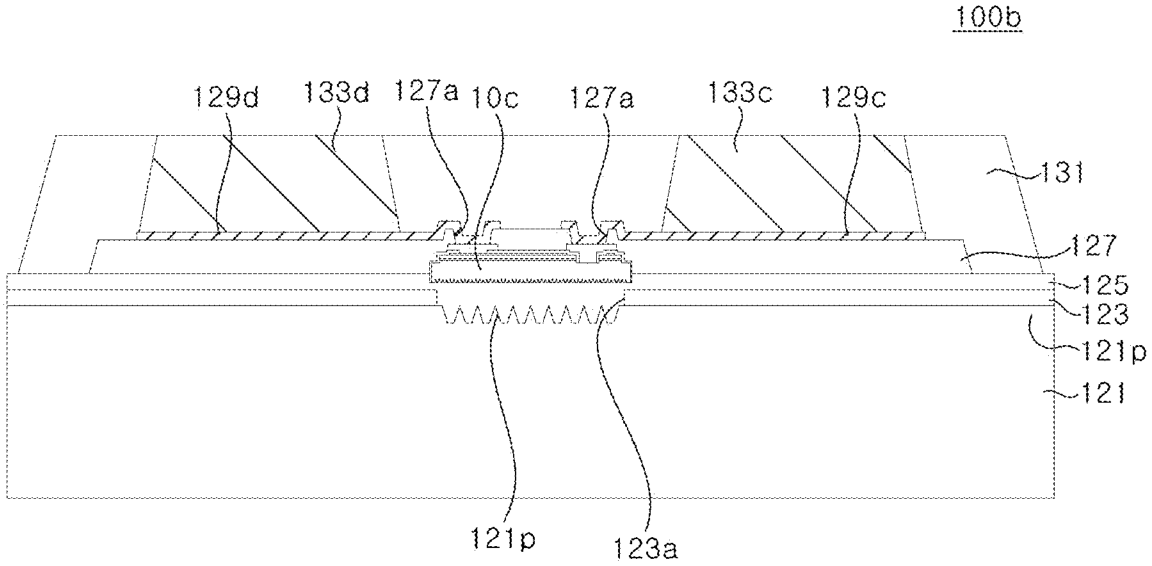
【FIG. 11A】
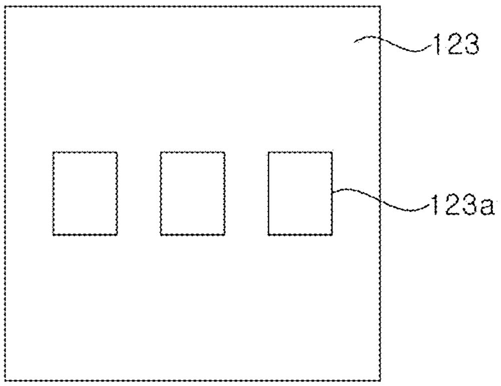

【FIG. 11B】
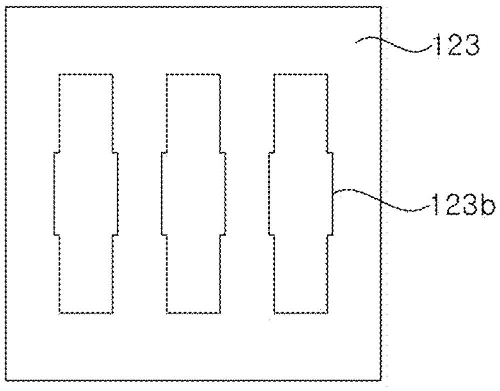
【FIG. 11C】
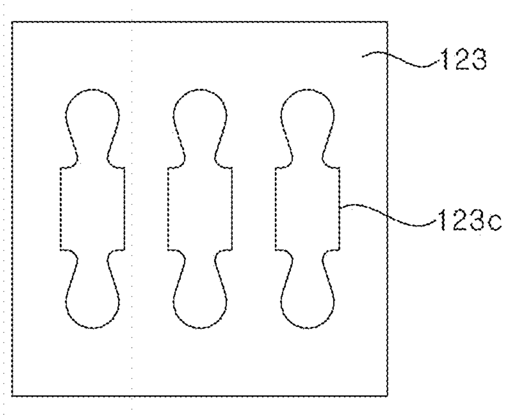
【FIG. 11D】
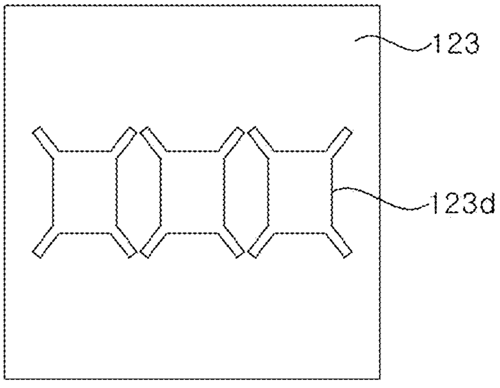

【FIG. 11E】
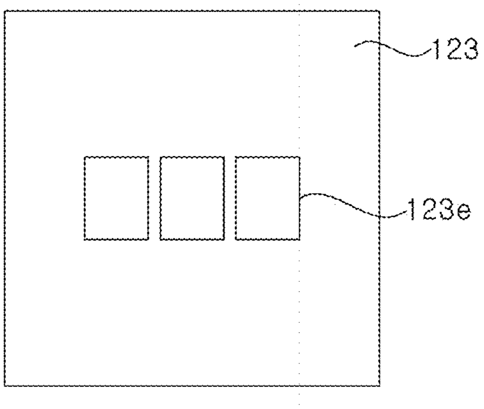
【FIG. 11F】
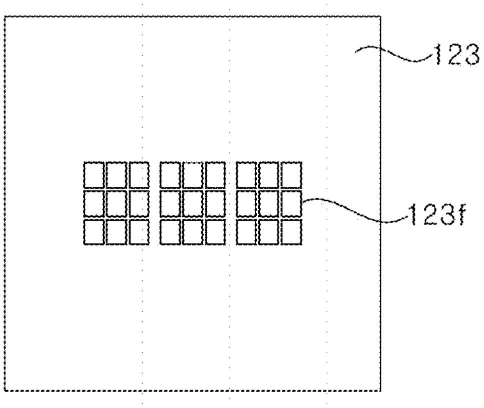
【FIG. 11G】
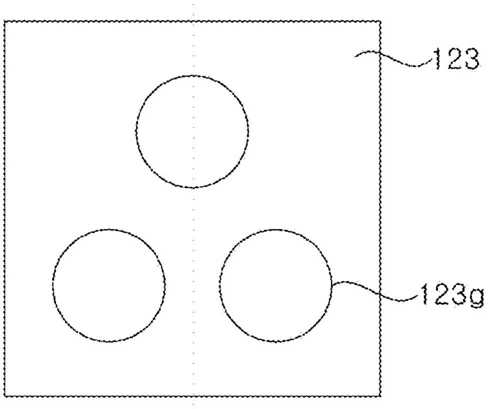

【FIG. 12】
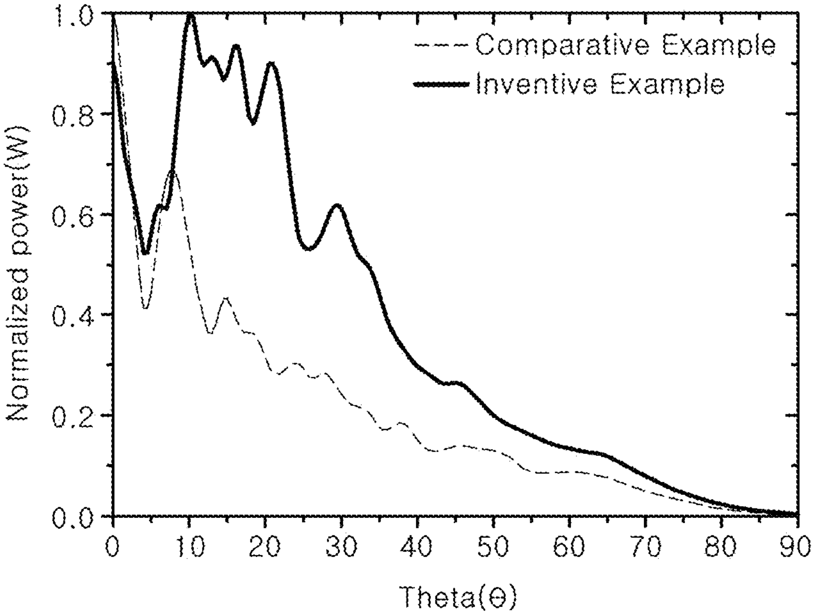

UNIT PIXEL HAVING LIGHT EMITTING DEVICE AND DISPLAYING APPARATUS

CROSS-REFERENCE TO RELATED APPLICATIONS

This application is a continuation of U.S. patent application Ser. No. 18/535,178, filed on Dec. 11, 2023, which is a continuation of U.S. patent application Ser. No. 17/168,958, filed on Feb. 5, 2021, now U.S. Pat. No. 11,843,077, which claims priority to and the benefit of U.S. Provisional Application No. 62/972,981, filed on Feb. 11, 2020, and U.S. Provisional Application No. 63/015,191, filed on Apr. 24, 2020. The aforementioned applications of which are incorporated herein by reference in their entireties.

TECHNICAL FIELD

Exemplary embodiments relate to a unit pixel having a light emitting device and a displaying apparatus having the same, and more particularly, relates to a unit pixel capable of setting viewing angles of light emitting devices to be uniform, and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and fast response, than existing light sources, and thus, light emitting diodes have been replacing existing light sources.

Conventional light emitting diodes have been generally used as backlight light sources in display apparatuses. However, displaying apparatuses that directly realize images using the light emitting diodes were recently developed. Such displays are also referred to as micro LED displays.

In general, the displaying apparatus displays various colors through mixture of blue, green, and red light. In order to realize various images, the displaying apparatus includes a plurality of pixels, and each includes sub-pixels corresponding to one of blue, green, and red light. As such, a color of a certain pixel is typically determined based on the colors of the sub-pixels, so that images can be realized through the combination of such pixels.

SUMMARY

Exemplary embodiments provide a unit pixel that is suitable for being mounted on a circuit board and a displaying apparatus having the same.

Exemplary embodiments provide a unit pixel having substantially uniform viewing angles of light emitted from sub-pixels, and a displaying apparatus having the same.

Exemplary embodiments provide a unit pixel, the unit pixel including: a transparent substrate; a plurality of light emitting devices arranged on the transparent substrate; and an optical layer disposed between the light emitting devices and the transparent substrate, and transmitting light emitted from the light emitting devices, in which the transparent substrate has a concavo-convex pattern on a surface facing the light emitting devices.

Exemplary embodiments provide a pixel module, the pixel module including: a circuit board; and a plurality of unit pixels disposed on the circuit board, in which each of the unit pixels includes: a transparent substrate; a plurality of light emitting devices arranged on the transparent substrate; and an optical layer disposed between the light emitting devices and the transparent substrate, and transmitting light emitted from the light emitting devices, in which the transparent substrate has a concavo-convex pattern on a surface facing the light emitting devices.

Exemplary embodiments provide a displaying apparatus, the displaying apparatus including: a panel substrate; and a plurality of pixel modules arranged on the panel substrate, in which each of the pixel modules includes: a circuit board; and a plurality of unit pixels disposed on the circuit board, in which each of the unit pixels includes: a transparent substrate; a plurality of light emitting devices arranged on the transparent substrate; and an optical layer disposed between the light emitting devices and the transparent substrate, and transmitting light emitted from the light emitting devices, in which the transparent substrate has a concavo-convex pattern on a surface facing the light emitting devices.

DESCRIPTION OF DRAWINGS

FIG. 1 is a schematic plan view illustrating a displaying apparatus according to one or more embodiments.

FIG. 2A is a schematic plan view illustrating a light emitting device according to one or more embodiments.

FIG. 2B is a schematic cross-sectional view taken along line A-A of FIG. 2A.

FIG. 3A is a schematic plan view illustrating a unit pixel according to one or more embodiments.

FIG. 3B is a schematic cross-sectional view taken along line B-B of FIG. 3A FIG. 4A is a schematic plan view illustrating a pixel module according to one or more embodiments.

FIG. 4B is a schematic cross-sectional view taken along line C-C of FIG. 4A FIG. 4C is a schematic rear view illustrating a pixel module according to one or more embodiments.

FIG. 4D is a schematic circuit diagram illustrating a pixel module according to one or more embodiments.

FIG. 4E is a schematic circuit diagram illustrating a pixel module according to one or more embodiments.

FIGS. 5A through 5K are schematic cross-sectional views illustrating a method of transferring light emitting devices according to one or more embodiments, where:

FIG. 5A is a schematic cross-sectional view illustrating forming a light emitting device on a substrate;

FIG. 5B is a schematic cross-sectional view illustrating forming a first mask layer on the substrate;

FIG. 5C is a schematic cross-sectional view illustrating forming a plurality of holes in the first mask layer;

FIG. 5D is a schematic cross-sectional view illustrating forming a connection layer on the first mask layer;

FIG. 5E is a schematic cross-sectional view illustrating coupling a first temporary substrate to an upper region of the connection layer;

FIG. 5F is a schematic cross-sectional view illustrating removing the substrate from the light emitting devices;

FIG. 5G is a schematic cross-sectional view illustrating removing the first mask layer from the light emitting devices;

FIG. 5H is a schematic cross-sectional view illustrating coupling a second temporary substrate to lower surfaces of the light emitting devices;

FIG. 5I is a schematic cross-sectional view illustrating separating each of the light emitting devices from the connection layer;

FIG. 5J is a schematic cross-sectional view illustrating disposing the light emitting devices on the secondary temporary substrate with a predetermined interval; and FIG. 5K is a schematic cross-sectional view illustrating transferring a portion of the light emitting devices to another substrate using a picker.

FIGS. 6A through 6L are schematic cross-sectional views illustrating a method of transferring light emitting devices according to one or more embodiments, where:

FIG. 6A is a schematic cross-sectional view illustrating growing a light emitting device on a substrate;

FIG. 6B is a schematic cross-sectional view illustrating forming a first mask layer on the substrate;

FIG. 6C is a schematic cross-sectional view illustrating forming a plurality of holes in the first mask layer;

FIG. 6D is a schematic cross-sectional view illustrating forming a connection layer on the first mask layer;

FIG. 6E is a schematic cross-sectional view illustrating coupling a first temporary substrate to an upper region of the connection layer;

FIG. 6F is a schematic cross-sectional view illustrating removing the substrate from the light emitting devices;

FIG. 6G is a schematic cross-sectional view illustrating removing the first mask layer from the light emitting devices;

FIG. 6H is a schematic cross-sectional view illustrating removing the first temporary substrate;

FIG. 6I is a schematic cross-sectional view illustrating coupling a secondary temporary substrate to a lower surface of the light emitting devices;

FIG. 6J is a schematic cross-sectional view illustrating removing the light emitting devices from the connection layer; and FIG. 6K is a schematic cross-sectional view illustrating disposing the light emitting devices on the secondary temporary substrate with a predetermined interval.

FIG. 6L is a schematic cross-sectional view illustrating transferring a portion of light emitting devices on the secondary temporary substrate to another substrate using a picker.

FIGS. 7A through 7K are schematic cross-sectional views illustrating a method of transferring light emitting devices according to one or more embodiments.

FIG. 7A is a schematic cross-sectional view illustrating forming a light emitting device on a substrate;

FIG. 7B is a schematic cross-sectional view illustrating forming a first mask layer on the substrate;

FIG. 7C is a schematic cross-sectional view illustrating coupling a first temporary substrate onto the first mask layer;

FIG. 7D is a schematic cross-sectional view illustrating removing the substrate from the light emitting devices;

FIG. 7E is a schematic cross-sectional view illustrating exposing a lower surface of the light emitting devices and a lower surface of the first mask layer;

FIG. 7F is a schematic cross-sectional view illustrating forming a plurality of holes in a second mast layer;

FIG. 7G is a schematic cross-sectional view illustrating forming a connection layer under the second mask layer;

FIG. 7H is a schematic cross-sectional view illustrating removing the first temporary substrate;

FIG. 7I is a schematic cross-sectional view illustrating removing the first mask layer and the second mask layer from the light emitting devices;

FIG. 7J is a schematic cross-sectional view illustrating disposing the light emitting devices over the second temporary substrate; and FIG. 7K is a schematic cross-sectional view illustrating separating the light emitting devices from a connection layer.

FIG. 8 is a schematic cross-sectional view illustrating a unit pixel according to one or more embodiments.

FIG. 9 is a schematic cross-sectional view illustrating a pixel module according to one or more embodiments.

FIG. 10 is a schematic cross-sectional view illustrating a unit pixel according to one or more embodiments.

FIGS. 11A, 11B, 11C, 11D, 11E, 11F, and 11G are schematic plan views illustrating various types of windows, where:

FIG. 11A is a schematic plan view illustrating windows formed in a rectangular shape;

FIG. 11B is a schematic plan view illustrating extensions formed in a rectangular shape;

FIG. 11C is a schematic plan view illustrating windows having extensions in a fan shape;

FIG. 11D is a schematic plan view illustrating windows having extensions in the diagonal direction;

FIG. 11E is a schematic plan view illustrating windows disposed at a narrower interval;

FIG. 11F is a schematic plan view illustrating a plurality of windows disposed in respective regions corresponding to the light emitting devices; and FIG. 11G is a schematic plan view illustrating windows having a circular shape and arranged in a triangular shape.

FIG. 12 is a graph illustrating viewing angle characteristics of light according to a presence or absence of a concavo-convex pattern on a transparent substrate.

DETAILED DESCRIPTION OF THE ILLUSTRATED EMBODIMENTS

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

In the case of the micro LED display, a micro LED is arranged on a two-dimensional plane corresponding to each sub pixel, and, accordingly, a large number of micro LEDs need to be arranged on a single substrate. However, the micro LED is extremely small, for example, 200 μm or less, further 100 μm or less, and special consideration for directly mounting light emitting diodes having small sizes on a display panel may be taken.

In addition, various colors are implemented by color combinations of sub-pixels, when viewing angles of light emitted from the sub-pixels are different, and colors vary depending on an angle at which a user sees a display image. For example, in a case that a viewing angle of red light is large and viewing angles of blue light and green light are small, when a white light image is implemented by a combination thereof, an image in which red light dominates may be observed depending on an angle at which a user sees the image even when white light is implemented in the vertical direction.

A unit pixel according to one or more embodiments includes a transparent substrate, a plurality of light emitting devices arranged on the transparent substrate, and an optical layer disposed between the light emitting devices and the transparent substrate and transmitting light emitted from the light emitting devices. The transparent substrate has a concavo-convex pattern on a surface facing the light emitting devices.

Viewing angles of light emitted from the light emitting devices may be set to be substantially uniform due to the concavo-convex pattern. The concavo-convex pattern may increase the viewing angles of light emitted from the light emitting devices.

Each of the plurality of light emitting devices may have a roughness on a surface facing the transparent substrate. The roughness improves light extraction efficiency of the light emitting device by reducing total internal reflection due to a difference in refractive index between the light emitting device and the optical layer.

In some forms, the plurality of light emitting devices may include at least three light emitting devices emitting light of different colors from one another, and the at least three light emitting devices may be arranged in a line.

The optical layer is not particularly limited as long as it is an optically transparent material, and may be gas, liquid or solid. In at least one variant, the light emitting devices may be coupled to the transparent substrate by a coupler such as a spacer, and a region between the light emitting devices and the transparent substrate may be filled with gas or liquid. Accordingly, the optical layer may be formed of gas or liquid transparent to light.

In another variant, the optical layer may be an adhesive layer. The light emitting devices may be attached to the transparent substrate by the adhesive layer.

Moreover, the unit pixel may further include: a step adjustment layer covering the light emitting device and adhered to the adhesive layer; and connection layers disposed on the step adjustment layer, and electrically connected to the light emitting devices.

In one or more embodiments, the plurality of light emitting devices may include light emitting devices emitting red, green, and blue light.

Each of the light emitting devices may include a light emitting structure including a first conductivity type semiconductor layer, a second conductivity type semiconductor layer, and an active layer interposed between the first and second conductivity type semiconductor layers, and a first electrode pad and a second electrode pad disposed on the light emitting structure., The step adjustment layer may have openings exposing the first and second electrode pads, and the connection layers may be electrically connected to the first and second electrode pads through the openings of the step adjustment layer.

The unit pixel may further include a protection layer covering the step adjustment layer and contact layers, and the protection layer may have openings located on the contact layers.

Moreover, the light emitting device may further include bumps disposed in the openings of the protection layer, and the bumps may be electrically connected to the contact layers, respectively.

The light emitting device may further include a light blocking layer disposed between the optical layer and the transparent substrate, and the light blocking layer may have windows configured to transmit light generated from the light emitting devices.

In at least one variant, at least one of the windows may have an extension extending in a direction perpendicular to a direction in which the light emitting devices are arranged.

A viewing angle of light emitted from a corresponding light emitting device may be increased by the extension.

In another variant, the window may have an extension extending in the diagonal direction.

In yet another variant, a plurality of windows may be arranged corresponding to each of the light emitting devices.

In further another variant, the concavo-convex pattern of the transparent substrate may be formed on an entire surface of the transparent substrate. In another variant, the concavo-convex pattern of the transparent substrate may be disposed corresponding to the windows.

A pixel module according to one or more embodiments includes: a circuit board; and a plurality of unit pixels disposed on the circuit board, in which each of the unit pixels includes a transparent substrate, a plurality of light emitting devices arranged on the transparent substrate, and an optical layer disposed between the light emitting devices and the transparent substrate, and transmitting light emitted from the light emitting devices., The transparent substrate has a concavo-convex pattern on a surface facing the light emitting devices.

Each of the plurality of light emitting devices may have a roughness on a surface facing the transparent substrate.

In addition, the unit pixel may further include a light blocking layer disposed between the optical layer and the transparent substrate, and the light blocking layer may include windows configured to transmit light generated from the light emitting devices.

In one or more embodiments, the concavo-convex pattern of the transparent substrate may be disposed corresponding to the windows.

In one or more embodiments, the optical layer may be an adhesive layer.

Moreover, the unit pixel may further include a step adjustment layer covering the light emitting device and adhered to the adhesive layer, connection layers disposed on the step adjustment layer, and electrically connected to the light emitting devices, and a protection layer covering the step adjustment layer and contact layers. Furthermore, the protection layer may have openings located on the contact layers.

The plurality of light emitting devices may include at least three light emitting devices emitting light of different colors from one another, and the at least three light emitting devices may be arranged in a line.

A displaying apparatus according to one or more embodiments includes: a panel substrate, and a plurality of pixel modules arranged on the panel substrate. Each of the pixel modules includes a circuit board, and a plurality of unit pixels disposed on the circuit board. Each of the unit pixels includes a transparent substrate, a plurality of light emitting devices arranged on the transparent substrate, and an optical layer disposed between the light emitting devices and the transparent substrate and transmitting light emitted from the light emitting devices. The transparent substrate has a concavo-convex pattern on a surface facing the light emitting devices.

Hereinafter, exemplary embodiments will be described in detail with reference to the accompanying drawings.

FIG. 1 is a schematic plan view illustrating a displaying apparatus according to one or more embodiments.

Referring to FIG. 1, a displaying apparatus 10000 includes a panel substrate 2100 and a plurality of pixel modules 1000.

The displaying apparatus 10000 is not particularly limited, but may include a Virtual Reality (VR) displaying apparatus such as a micro LED TV, a smart watch, a VR headset, or an Augmented Reality (AR) displaying apparatus such as augmented reality glasses.

The panel substrate 2100 may include a circuit for passive matrix driving or active matrix driving. In one or more embodiments, the panel substrate 2100 may include interconnection lines and resistors, and in another exemplary embodiment, the panel substrate 2100 may include interconnection lines, transistors, and capacitors. The panel substrate 2100 may also have pads that are capable of being electrically connected to the disposed circuit on an upper surface thereof.

The plurality of pixel modules 1000 is arranged on the panel substrate 2100. Each of the pixel modules 1000 may include a circuit board and a plurality of unit pixels 100 disposed on the circuit board.

In addition, each of the unit pixels 100 includes a plurality of light emitting devices 10*a*, 10*b*, and 10*c*. The light emitting devices 10*a*, 10*b*, and 10*c* may emit light of different colors from one another. In some forms, the light emitting devices 10*a*, 10*b*, and 10*c* in each of the unit pixels 100 may be arranged as shown in FIG. 1. In other forms, the light emitting devices 10*a*, 10*b*, and 10*c* may be arranged in the vertical direction with respect to a display screen on which an image is implemented. However, the inventive concepts are not limited thereto, and the light emitting devices 10*a*, 10*b*, and 10*c* may be arranged in a lateral direction with respect to the display screen on which the image is implemented.

Hereinafter, each element of the displaying apparatus 10000 will be described in detail in the order of the light emitting devices 10*a*, 10*b*, and 10*c*, the unit pixel 100, and the pixel module 1000 that are disposed in the displaying apparatus 10000.

First, FIG. 2A is a schematic plan view illustrating a light emitting device according to one or more embodiments, and FIG. 2B is a schematic cross-sectional view taken along line A-A of FIG. 2A. Herein, the light emitting device 10*a* is described in detail, and to the extent that the light emitting devices 10*b* and 10*c* have similar structures, the descriptions of the light emitting device 10*a* are relevant to the light emitting devices 10*b* and 10*c*.

Referring to FIGS. 2A and 2B, the light emitting device 10*a* includes a light emitting structure including a first conductivity type semiconductor layer 21, an active layer 23, and a second conductivity type semiconductor layer 25. Further, the light emitting device 10*a* may include an ohmic contact layer 27, an insulation layer 29, a first electrode pad 31, and a second electrode pad 33.

The light emitting structure, that is, the first conductivity type semiconductor layer 21, the active layer 23, and the second conductivity type semiconductor layer 25 may be grown on a substrate. The substrate may be various substrates that are used to grow semiconductors, such as gallium nitride substrate, GaAs substrate, Si substrate, sapphire substrate, especially patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain as at least a portion of the first conductivity type semiconductor layer 21.

When the light emitting device 10*a* emits red light according to one or more embodiments, the semiconductor layers may include aluminum gallium arsenide (AlGaAs), gallium arsenide phosphide (GaAsP), aluminum gallium indium phosphide (AlGaInP), or gallium phosphide (GaP).

When the light emitting device 10*b* emits green light according to one or more embodiments, the semiconductor layers may include indium gallium nitride (InGaN), gallium nitride (GaN), gallium phosphide (GaP), aluminum gallium indium phosphide (AlGaInP), or aluminum gallium phosphide (AlGaP).

When the light emitting device 10*c* emits blue light according to one or more embodiments, the semiconductor layers may include gallium nitride (GaN), indium gallium nitride (InGaN), or zinc selenide (ZnSe).

The first conductivity type and the second conductivity type have opposite polarities, when the first conductivity type is an n-type, the second conductivity type becomes a p-type, and, when the second conductivity type is a p-type, the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In one or more embodiments, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 2A and 2B, these layers may be multiple layers, and may also include a superlattice layer. The active layer 23 may include a single quantum well structure or a multiple quantum well structure, and a composition ratio of a nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 2B. The mesa M may be disposed on the portion of the first conductivity type semiconductor layer 21, and an upper surface of the first conductivity type semiconductor layer 21 may be exposed around the mesa M.

Meanwhile, the first conductivity type semiconductor layer 21 may have a roughness 21*p* due to surface texturing, as shown in FIG. 2B. Surface texturing may be carried out by patterning, for example, using a dry or wet etching process. For example, cone-shaped protrusions may be formed, an elevation of the cone may be about 2 μm to about 3 μm, a distance between the cones may be about 1.5 μm to about 2 μm, and a diameter of a bottom of the cone may be about 3 μm to about 5 μm. The cone may also be truncated, in which a diameter of an upper surface of the cone may be about 2 μm to about 3 μm. By forming roughness on the surface of the first conductivity type semiconductor layer 21, total internal reflection may be reduced, thereby increasing light extraction efficiency. Surface texturing may be performed on the first conductivity type semiconductor layers in all of the first, second, and third light emitting devices 10*a*, 10*b*, and 10*c*, but the inventive concepts are not limited thereto, and, in some exemplary embodiments, surface texturing may not be performed in some of the light emitting devices.

In addition, the mesa M may have a through hole 25*a* exposing the first conductivity type semiconductor layer 21. The through hole 25*a* may be disposed close to one edge of the mesa M, but is not limited thereto, and, in some exemplary embodiments, the through hole 25*a* may be disposed at a center of the mesa M.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The insulation layer 29 covers the mesa M and the ohmic contact layer 27. The insulation layer 29 may further cover upper and side surfaces of the first conductivity type semiconductor layer 21 exposed around the mesa M. The insulation layer 29 may have an opening 29*a* exposing the ohmic contact layer 27 and an opening 29*b* exposing the first conductivity type semiconductor layer 21 in the through hole 25*a*. The insulation layer 29 may be formed of a single layer or multiple layers of a silicon oxide film or a silicon nitride film. The insulation layer 29 may also include an insulation reflector, such as a distributed Bragg reflector.

The first electrode pad 31 and the second electrode pad 33 are disposed on the insulation layer 29. The second electrode pad 33 may be electrically connected to the ohmic contact layer 27 through the opening 29*a*, and the first electrode pad 31 may be electrically connected to the first conductivity type semiconductor layer 21 through the opening 29*b*, as shown in FIG. 2B.

The first and/or second electrode pads 31 and 33 may be formed of a single layer or a multiple layer of metal. As a material of the first and/or second electrode pads 31 and 33, a metal such as Al, Ti, Cr, Ni, Au, or the like and an alloy thereof or the like may be used.

Although not shown, the light emitting device 10*a* may further include a layer having additional functions in addition to the above-described layers. For example, various layers such as a reflective layer for reflecting light, an additional insulation layer for insulating a specific element, and a solder preventing layer for preventing diffusion of solder may be further included.

When a flip chip type light emitting device is formed, the mesa may be formed to have various shapes, and the locations and shapes of the first and second electrode pads 31 and 33 may also have various modifications. In addition, the ohmic contact layer 27 may be omitted, and the second electrode pad 33 may directly contact the second conductivity type semiconductor layer 25. Although the first electrode pad 31 is shown as being directly connected to the first conductivity type semiconductor layer 21, the contact layer may be formed first on the first conductivity type semiconductor layer 21 exposed to the through hole 25*a*, and the first electrode pad 31 may be connected to the contact layer.

FIG. 3A is a schematic plan view illustrating a unit pixel 100 according to one or more embodiments, and FIG. 3B is a schematic cross-sectional view taken along line B-B of FIG. 3A.

Referring to FIG. 3A and FIG. 3B, the unit pixel 100 may include a transparent substrate 121, a first, second, and third light emitting devices 10*a*, 10*b*, and 10*c*, a light blocking layer 123, and an adhesive layer 125, a step adjustment layer 127, connection layers 129*a*, 129*b*, 129*c*, and 129*d*, bumps 133*a*, 133*b*, 133*c*, and 133*d*, and a protection layer 131.

The unit pixel 100 provides a single pixel including the first, second, and third light emitting devices 10*a*, 10*b*, and 10*c*. The first, second, and third light emitting devices 10*a*, 10*b*, and 10*c* emit light of different colors, and the first, second, and third light emitting devices 10*a*, 10*b*, and 10*c* correspond to subpixels, respectively.

The transparent substrate 121 is a light-transmitting substrate such as PET, glass substrate, quartz, sapphire substrate, or the like. The transparent substrate 121 is disposed on a light emitting surface of the displaying apparatus (10000 in FIG. 1), and light emitted from the light emitting devices 10*a*, 10*b*, and 10*c* is emitted to the outside through the transparent substrate 121. The transparent substrate 121 may include a concavo-convex pattern 121*p* on a surface facing the light emitting devices 10*a*, 10*b*, and 10*c*. The concavo-convex pattern 121*p* scatters light emitted from the light emitting devices 10*a*, 10*b*, and 10*c* to increase viewing angles. In addition, light emitted from the light emitting devices 10*a*, 10*b*, and 10*c* having different viewing angle characteristics may be emitted as light having substantially uniform viewing angles by the concavo-convex pattern 121*p*. Accordingly, occurrence of a color difference depending on an angle at which a user sees a display image may be substantially reduced.

The concavo-convex pattern 121*p* may be regular or irregular. The concavo-convex pattern 121P may have a pitch of about 3 μm, a diameter of about 2.8 μm, and an elevation of about 1.8 μm, for example. The concavo-convex pattern 121*p* may be a pattern generally applied to a patterned sapphire substrate, but is not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

As the transparent substrate 121 is disposed on the light emitting surface, the transparent substrate 121 does not include a circuit such as a connection circuit, a driving circuit, etc. However, the inventive concepts are not limited thereto, and, in some exemplary embodiments, the transparent substrate 121 may include circuit(s).

Although a single unit pixel 100 is illustrated to be formed on a single transparent substrate 121, a plurality of unit pixels 100 may be formed on the single transparent substrate 121.

The light blocking layer 123 may include an absorbing material which absorbs light such as carbon black. The light absorbing material may prevent light generated in the light emitting devices 10*a*, 10*b*, and 10*c* from leaking from a region between the transparent substrate 121 and the light emitting devices 10*a*, 10*b*, and 10*c* toward a side surface thereof, and may improve contrast of the displaying apparatus.

The light blocking layer 123 may have a window 123*a* for a light path, so that light generated in the light emitting devices 10*a*, 10*b*, and 10*c* is incident on the transparent substrate 121. A width of the window 123*a* may be smaller than that of the light emitting device, but is not limited thereto, and, in some exemplary embodiments, may be greater than or equal to the width of the light emitting device.

The window 123*a* of the light blocking layer 123 also defines an arrangement location of the light emitting devices 10*a*, 10*b*, and 10*c*. As such, separate arrangement markers for defining arrangement locations of the light emitting devices 10*a*, 10*b*, and 10*c* may be omitted. However, the inventive concepts are not limited thereto, and, in some exemplary embodiments, the arrangement markers may be disposed on the transparent substrate 121, or on the light blocking layer 123 or the adhesive layer 125 to provide locations to arrange the light emitting devices 10*a*, 10*b*, and 10*c*.

Viewing angles of light emitted from the light emitting devices 10*a*, 10*b*, and 10*c* may be adjusted according to a shape of the window 123*a* formed on the light blocking layer 123. This will be described in detail later with reference to FIGS. 11A through 11F.

The adhesive layer 125 is attached onto the transparent substrate 121. The adhesive layer 125 may cover the light blocking layer 123. The adhesive layer 125 may be attached onto an entire surface of the transparent substrate 121, but is not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10*a*, 10*b*, and 10*c* to the transparent substrate 121. The adhesive layer 125 may fill the window 123*a* formed in the light blocking layer 123.

The adhesive layer 125 may be formed as a light-transmitting layer, and transmits light emitted from the light emitting devices 10*a*, 10*b*, and 10*c*. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10*a*, 10*b* and 10*c* from being observed from the light emitting surface.

The first, second, and third light emitting devices 10*a*, 10*b*, and 10*c* are disposed on the transparent substrate 121. The first, second, and third light emitting devices 10*a*, 10*b*, and 10*c* may be attached to the transparent substrate 121 by the adhesive layer 125. The first, second, and third light emitting devices 10*a*, 10*b*, and 10*c* may be disposed to correspond to the windows 123*a* of the light blocking layer 123. When the light blocking layer 123 is omitted, the arrangement markers may be added to provide the arrangement locations of the light emitting devices 10*a*, 10*b*, and 10*c*.

The first, second, and third light emitting devices 10*a*, 10*b*, and 10*c* may be, for example, red light emitting devices, green light emitting devices, and blue light emitting devices. Since specific configurations of each of the first, second, and third light emitting devices 10*a*, 10*b*, and 10*c* are the same as those described with reference to FIG. 2A and FIG. 2B, detailed descriptions thereof will be omitted.

The first, second, and third light emitting devices 10*a*, 10*b*, and 10*c* may be arranged in a line, as shown in FIG. 3A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut clean. In this case, the clean-cut surfaces of the sapphire substrate 121 may be flush with an arrangement direction of the light emitting devices 10*a*, 10*b*, and 10*c*. For example, in FIG. 3A, the clean-cut surfaces (e.g., m-plane) may be disposed up and down, and the two remaining cut surfaces (e.g., a-plane) may be disposed left and right.

The first, second, and third light emitting devices 10*a*, 10*b*, and 10*c* may be those described above with reference to FIG. 2A and FIG. 2B, but the inventive concepts are not limited thereto, and various light emitting devices having a lateral or flip chip structure may be used.

The step adjustment layer 127 covers the first, second, and third light emitting devices 10*a*, 10*b*, and 10*c*. The step adjustment layer 127 has openings 127*a* exposing the first and second electrode pads 31 and 33 of the light emitting devices 10*a*, 10*b*, and 10*c*. The step adjustment layer 127 is required to form the connection layers 129*a*, 129*b*, 129*c*, and 129*d* and the bumps 133*a*, 133*b*, 133*c*, and 133*d*. In particular, the step adjustment layer 127 may be formed to equalize elevations of locations where the bumps 133*a*, 133*b*, 133*c*, and 133*d* are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

The connection layers 129*a*, 129*b*, 129*c*, and 129*d* are formed on the step adjustment layer 127. The connection layers 129*a*, 129*b*, 129*c*, and 129*d* may be connected to the first and second electrode pads 31 and 33 of the first, second, and third light emitting devices 10*a*, 10*b*, and 10*c* through the openings 127*a* of the step adjustment layer 127.

For example, the connection layer 129*a* may be electrically connected to a first conductivity type semiconductor layer of the first light emitting device 10*a*, the connection layer 129*b* may be electrically connected to a first conductivity of the second light emitting device 10*b*, the connection layer 129*c* may be electrically connected to a first conductivity type semiconductor layer of the third light emitting device 10*c*, and the connection layer 129*d* may be commonly electrically connected to second conductivity type semiconductor layers of the first, second, and third light emitting devices 10*a*, 10*b*, and 10*c*. The connection layers 129*a*, 129*b*, 129*c*, and 129*d* may be formed together on the step adjustment layer 127, and may include, for example, Au.

The bumps 133*a*, 133*b*, 133*c*, and 133*d* are formed on the connection layers 129*a*, 129*b*, 129*c*, and 129*d*, respectively. For example, the first bump 133*a* may be electrically connected to the first conductivity type semiconductor layer of the first light emitting device 10*a* through the connection layer 129*a*, the second bump 133*b* may be electrically connected to the first conductivity type semiconductor layer of the second light emitting device 10*b* through the connection layer 129*b*, and the third bump 133*c* may be electrically connected to the first conductivity type semiconductor layer of the third light emitting device 10*c* through the connection layer 129*c*. The fourth bump 133*d* may be commonly electrically connected to the second conductivity type semiconductor layers of the first, second, and third light emitting devices 10*a*, 10*b*, and 10*c* through the connection layer 129*d*. The bumps 133*a*, 133*b*, 133*c*, and 133*d* may be formed of, for example, a metal and/or a metal alloy such as AuSn, SnAg, Sn, CuSn, CuN, CuAg, Sb, Ni, Zn, Mo, Co, solder, or the like.

The protection layer 131 may cover side surfaces of the bumps 133*a*, 133*b*, 133*c*, and 133*d*, and may cover the step adjustment layer 127. In addition, the protection layer 131 may cover the adhesive layer 125 exposed around the step adjustment layer 127. The protection layer 131 may be formed of, for example, a photosensitive solder resist (PSR), and, accordingly, the protection layer 131 may be patterned first through photolithography and development processes, and then the bumps 133*a*, 133*b*, 133*c*, and 133*d* may be formed. To this end, the protection layer 131 may be formed to have openings exposing the contact layers 129*a*, 129*b*, 129*c*, and 129*d*, and the bumps 133*a*, 133*b*, 133*c*, and 133*d* may be formed in the openings of the protection layer 131. The bumps 133*a*, 133*b*, 133*c*, and 133*d* may be omitted. The protection layer 131 may be formed of a light absorbing material such as a white reflective material or a black epoxy to prevent light leakage.

In the illustrated exemplary embodiment, the light emitting devices 10*a*, 10*b*, and 10*c* are described as being attached to the transparent substrate 121 by the adhesive layer 125, but the light emitting devices 10*a*, 10*b*, and 10*c* may be coupled to the transparent substrate 121 using another coupler instead of the adhesive layer 125. For example, the light emitting devices 10*a*, 10*b*, and 10*c* may be coupled to the transparent substrate 121 using spacers, and thus, gas or liquid may be filled in a region between the light emitting devices 10*a*, 10*b*, and 10*c* and the transparent substrate 121. An optical layer that transmits light emitted from the light emitting devices 10*a*, 10*b*, and 10*c* may be formed by the gas or liquid. The adhesive layer 125 described above is also an example of the optical layer. Herein, the optical layer is formed of a material such as gas, liquid, or solid, different from those of the light emitting devices 10*a*, 10*b*, and 10*c*, and thus, is distinguished from the materials of the semiconductor layers in the light emitting devices 10*a*, 10*b*, and 10*c*.

FIG. 4A is a schematic plan view illustrating a pixel module 1000 according to one or more embodiments, FIG. 4B is a schematic cross-sectional view taken along line C-C of FIG. 4A, FIG. 4C is a rear view of the pixel module 1000, and FIG. 4D is a circuit diagram of the pixel module 1000.

Referring to FIGS. 4A and 4B, the pixel module 1000 includes a circuit board 1001 and unit pixels 100 arranged on the circuit board 1001. The pixel module 1000 may further include a cover layer 1010 covering the unit pixels 100.

The circuit board 1001 may have a circuit for electrically connecting a panel substrate 2100 and light emitting devices 10*a*, 10*b*, and 10*c*. The circuit in the circuit board 1001 may be formed to have a multilayer structure. The circuit board 1001 may also include a passive circuit for driving the light emitting devices 10*a*, 10*b*, and 10*c* in a passive matrix driving manner or an active circuit for driving the light emitting devices 10*a*, 10*b*, and 10*c* in an active matrix driving manner. The circuit board 1001 may include pads 1003 exposed on a surface thereof. The pads 1003 may be arranged corresponding to bumps in the unit pixels 100 to be mounted thereon.

Since a detailed configuration of the unit pixels 100 is the same as that described with reference to FIGS. 3A and 3B, detailed descriptions thereof will be omitted to avoid redundancy. The unit pixels 100 may be arranged on the circuit board 1001. The unit pixels 100 may be arranged in a 2×2 matrix as shown in FIG. 4A, but the inventive concepts are not limited thereto, and, in some exemplary embodiments, the unit pixels 100 may be arranged in various matrices such as 2×3, 3×3, 4×4, 5×5, or the like.

The unit pixels 100 are bonded to the circuit board 1001 by a bonding material 1005. For example, the bonding material 1005 may bond the bumps 133*a*, 133*b*, 133*c*, and 133*d* to the pads 1003. When the bumps 133*a*, 133*b*, 133*c*, and 133*d* are formed of solder, the bonding material 1005 may be omitted.

The cover layer 1010 covers a plurality of unit pixels 100. The cover layer 1010 may improve contrast of the displaying apparatus by preventing optical interference between the unit pixels 100.

The cover layer 1010 may be formed of, for example, a dry-film type solder resist (DFSR), a photoimageable solder resist (PSR), a black material (BM), an epoxy molding compound (EMC), or the like. The cover layer 1010 may be formed using, for example, a technique such as lamination, spin coating, slit coating, printing, or the like.

A displaying apparatus 10000 may be provided by mounting the pixel modules 1000 on the panel substrate 2100 of FIG. 1 as shown in FIG. 4A and FIG. 4B. The circuit board 1001 has bottom pads connected to the pads 1003. The bottom pads may be arranged in a one-to-one correspondence with the pads 1003, but the number of the bottom pads may be reduced through a common connection. In this regard, the pixel module 1000 having the unit pixels 100 arranged in a 2×2 matrix will be described with reference to FIG. 4C and FIG. 4D as an example.

FIG. 4C illustrates a rear view of the pixel module 1000, and bottom pads C1, C2, R1, R2, G1, G2, B1, and B2 of the circuit board 1001 are illustrated. Since the pixel modules 1000 are arranged in a 2×2 matrix, a total of four pixel modules are arranged on the circuit board 1001. Three light emitting devices 10*a*, 10*b*, and 10*c* and four bumps 133*a*, 133*b*, 133*c*, and 133*d* are disposed on each pixel module 1000. Accordingly, sixteen pads 1003 corresponding to the bumps of the four unit pixels 100 will be provided on the circuit board 1001. However, only eight bottom pads may be disposed, and the eight bottom pads may be connected to the panel substrate 2100 to individually drive each of the light emitting devices 10*a*, 10*b*, and 10*c*.

FIG. 4D illustrates a schematic circuit diagram in which each of the light emitting devices 10*a*, 10*b*, and 10*c* are connected to the bottom pads C1, C2, R1, R2, G1, G2, B1, and B2.

Referring to FIG. 4D, the bottom pad C1 is commonly connected to cathodes of the light emitting devices 10*a*, 10*b*, and 10*c* disposed in the left column, and the bottom pad C2 is commonly connected to cathodes of the light emitting devices 10*a*, 10*b*, and 10*c* disposed in the right column.

In the unit pixels 100 arranged in the upper row, a bottom pad R1 may be connected to anodes of the first light emitting devices 10*a*, a bottom pad G1 may be connected to anodes of the second light emitting devices 10*b*, and a bottom pad B1 may be connected to anodes of the third light emitting devices 10*c*.

In the unit pixels 100 arranged in the lower row, a bottom pad R2 may be connected to the anodes of the first light emitting devices 10*a*, a bottom pad G2 may be connected to the anodes of the second light emitting devices 10*b*, and a bottom pad B2 may be connected to the anodes of the third light emitting devices 10*c*.

Herein, the bottom pads R1, G1, B1, R2, G2, and B2 represent pads connected to red, green, and blue light emitting devices, respectively. However, the order of arrangement of the red, green, and blue light emitting devices may be changed, and, accordingly, locations to which the bottom pads R1, G1, B1, R2, G2, and B2 are connected may also be changed. For example, the circuit diagram of FIG. 4D shows the bottom pads based on the assumption that the first light emitting devices 10*a* are red light emitting devices, the second light emitting devices 10*b* are green light emitting devices, and the third light emitting devices 10*c* are blue light emitting devices. Alternatively, the first light emitting devices 10*a* may be the blue light emitting devices, and the third light emitting devices 10*c* may be the red light emitting devices, and, in this case, the locations of the bottom pads R1 and R2 and the bottom pads B1 and B2 may be interchanged.

According to the illustrated exemplary embodiment, since the bottom pads C1 and C2 are commonly connected to the cathodes of the light emitting devices in each column, and each of the bottom pads R1, G1, B1, R2, B2, and G2 are connected to the anodes of the two light emitting devices, each of the light emitting devices 10*a*, 10*b*, and 10*c* may be driven independently while reducing the total number of the bottom pads.

Although it is described and illustrated that the bottom pads C1 and C2 are connected to the cathodes of the light emitting devices and the bottom pads R1, G1, B1, R2, B2 and G2 are connected to the anodes of the light emitting device in the illustrated exemplary embodiment, the bottom pads C1 and C2 may be connected to the anodes of the light emitting devices, and the bottom pads R1, G1, B1, R2, B2 and G2 may be connected to the cathodes of the light emitting device as shown in FIG. 4E.

Herein, although the pixel module 1000 is described that the unit pixels 100 are arranged in a 2×2 matrix, the number of the bottom pads may be reduced using a common connection circuit even when the unit pixels 100 are arranged in another matrix such as 3×3, 5×5, or the like.

The light emitting devices 10*a*, 10*b*, and 10*c* in the pixel module 1000 may be individually driven by a driving IC disposed on the panel substrate 2100, and images may be implemented by a plurality of pixel modules 1000.

FIGS. 5A through 5K are schematic cross-sectional views illustrating a method of transferring light emitting devices according to one or more embodiments.

Referring to FIG. 5A, a light emitting device 10 is formed on a substrate 51. The substrate 51 may be a substrate that grows semiconductor layers of the light emitting device 10. The substrate 51 may be, for example, a sapphire substrate or a GaN substrate for growing an AlInGaN-based semiconductor layer, or a GaAs substrate for growing AlNGaP-based semiconductor layers. For example, when the light emitting device 10 is a blue light emitting device or a green light emitting device, the sapphire substrate or the GaN substrate may be used, and, when the light emitting device 10 is a red light emitting device, the GaAs substrate may be used.

Referring to FIG. 5B, a first mask layer 53 is formed on the substrate 51 to cover a plurality of light emitting devices 10. The first mask layer 53 may be formed to completely cover the plurality of light emitting devices 10, and may be formed to have a predetermined thickness on upper surfaces of the light emitting devices 10.

Referring to FIG. 5C, a plurality of holes Hs are formed in the first mask layer 53. Each of the plurality of holes Hs may be formed over the plurality of light emitting devices 10, and at least one hole H may be formed on each of the light emitting devices 10. In the illustrated exemplary embodiment, three holes Hs are formed on each of the light emitting devices 10, and the three holes Hs are arranged asymmetrically to at least one direction where the light emitting devices 10 are arranged, as shown in FIG. 5C. Herein, the three holes Hs in FIG. 5C are arranged asymmetrically to a direction which is perpendicular to the direction where the light emitting devices 10 are arranged.

The first mask layer 53 may be formed of a photosensitive material, and the plurality of holes Hs may be formed through a photolithography process. The plurality of holes Hs may be formed through an exposure and development processes, but the inventive concepts are not necessarily limited thereto, but an etching process may be used. The plurality of holes Hs may be formed to have a triangular shape as shown in FIG. 5C. However, the number of holes Hs is not necessarily limited to three.

Referring to FIG. 5D, a connection layer 55 is formed on the first mask layer 53. The connection layer 55 is formed on the first mask layer 53 while filling the plurality of holes Hs formed in the first mask layer 53. Since at least one hole H is formed over each of the light emitting devices 10, the connection layer 55 may be connected to the light emitting device 10 through at least one hole H formed over the light emitting device 10. A connection portion 55*a* connected to the light emitting device 10 by filling the hole H is formed together while the connection layer 55 is formed.

The connection layer 55 may be formed of an organic material such as poly dimethylpolysiloxane (PDMS), epoxy, acryl, color polyimide, or the like, but it is not limited thereto. Herein, the connection layer 55 may have a light transmittance of 90% or more, and a refractive index may be about 1.4 to about 1.7.

Referring to FIG. 5E, a first temporary substrate 57 is coupled to an upper region of the connection layer 55. The first temporary substrate 57 may be a polymer substrate such as PET, PEN, PI sheet, or the like, or may be a substrate such as glass, PC, PMMA, or the like. When the first temporary substrate 57 is coupled to the upper region of the connection layer 55, bubbles generated in the connection layer 55 in a vacuum state may be removed, and a hardening process of the connection layer 55 may be carried out at a temperature lower than a melting point of the first mask layer 53. In this process, the first temporary substrate 57 may be coupled to the connection layer 55.

When the first temporary substrate 57 is coupled to the connection layer 55, the substrate 51 is removed from the light emitting devices 10 as shown in FIG. 5F. The substrate 51 may be removed by a laser lift-off process or a wet etching process. For example, if the substrate 51 is a sapphire substrate, the substrate 51 may be removed by the laser lift-off process or a chemical lift-off process, and if the substrate 51 is a GaAs substrate, the GaAs substrate may be removed by the wet etching process.

Referring to FIG. 5G, in a state that the substrate 51 is removed, the first mask layer 53 is removed from the light emitting devices 10. The first mask layer 53 may be removed using, for example, acetone, a dedicated striper, etching, or the like. Since the first mask layer 53 is removed, as shown in FIG. 5C, each of the light emitting devices 10 is connected to the connection layer 55 through at least one connection portion 55*a* and maintained.

Referring to FIG. 5H, after the first mask layer 53 is removed from the light emitting devices 10, a second temporary substrate 59 is coupled to lower surfaces of the light emitting devices 10. The second temporary substrate 59 may be a rubber or UV sheet, or may be a polymer substrate such as PET, PEN, PI sheet, or the like, or a substrate such as glass, PC, PMMA, or the like.

When coupling the second temporary substrate 59 to the light emitting devices 10 is completed, the light emitting devices 10 are removed from the connection layer 55 using the second temporary substrate 59 as shown in FIG. 5I. By applying an external force in an opposite direction to the first temporary substrate 57, i.e., downward, to the second temporary substrate 59 coupled to the light emitting devices 10, the at least one connection portion 55*a* connected to the light emitting devices 10 is cut, and the light emitting devices 10 are separated from the connection layer 55.

The external force applied to the second temporary substrate 59 as shown in FIG. 5J, may be applied in a direction perpendicular to the connection layer 55 at one side of the second temporary substrate 59. As such, each of the light emitting devices 10 may be separated from the connection layer 55 in such a manner that the at least one connection portion 55*a* connected to each of the light emitting devices 10 is sequentially cut from one side of the second temporary substrate 59.

Referring to FIG. 5J, the light emitting devices 10 separated from the connection layer 55 are disposed on the second temporary substrate 59 with a predetermined interval. In the meantime, a connection tip 55*b* may be formed on each of the light emitting devices 10 as a residue while the connection portion 55*a* is cut. Accordingly, the connection tip 55*b* is formed of the same material as the connection layer 55, and formed while the connection portion 55*a* is cut by an external force, so that thicknesses of the connection tips 55*b* may be irregular and different from one another.

Referring to FIG. 5J and FIG. 5K, a portion of the light emitting devices 10 disposed on the second temporary substrate 59 is transferred to another substrate using a picker 70. The picker 70 may include an elastomeric stamp, for example.

The picker 70 picks up and transfers a portion of the plurality of light emitting devices 10, and selectively picks up the light emitting devices 10 in accordance with an interval between light emitting devices 10 which will be arranged on the transparent substrate 121 (FIGS. 3A and 3B). As such, as shown in the drawing, the picker 70 doesn't pick up adjacent light emitting devices 10 together, but picks up the light emitting devices 10 having a certain interval at a time. The interval between the light emitting devices 10 picked up may vary depending on an interval between pixels in the transparent substrate 121 onto which the light emitting devices 10 are to be transferred.

After the light emitting devices 10 are arranged on the transparent substrate 121 to correspond to a plurality of unit pixels 100, the transparent substrate 121 may be cut in each pixel unit to form the unit pixel 100. As such, the light emitting devices 10 are transferred onto the transparent substrate 121 to correspond to each unit pixel 100.

The picker 70 picks up the light emitting devices 10 to fit an interval matching an interval between the unit pixels 100, and one of the first light emitting device 10*a*, the second light emitting device 10*b*, and the third light emitting device 10*c* may be picked up to be arranged in a single unit pixel 100.

The light emitting devices 10 may be picked up in a state that the first and second electrode pads 31 and 33 are disposed thereon (FIG. 5J) according to the exemplary embodiment, and may be also transferred to the transparent substrate 121 in this state. As such, light generated in the light emitting structure may be emitted to the outside through the transparent substrate 121. In another exemplary embodiment, the light emitting devices 10 may be mounted on a circuit board, and, in this case, the first and second electrode pads 31 and 33 may be mounted toward the circuit board. To do this, an additional temporary substrate may be used in a process of mounting the light emitting devices 10 on the circuit board using the picker 70. More particularly, the light emitting devices 10 picked up through the picker 70 may be first arranged on the additional temporary substrate at the interval between the unit pixels 100. Thereafter, the light emitting devices 10 disposed on the additional temporary substrate may be transferred to the circuit board at a time. As such, the light emitting devices 10 may be transferred, so that the first and second electrode pads 31 and 33 may be bonded to the circuit board.

FIGS. 6A through 6L are schematic cross-sectional views illustrating a method of transferring light emitting devices according to another exemplary embodiment.

Referring to FIG. 6A, a light emitting device 10 is grown on a substrate 51. The substrate 51 may be a substrate that grows semiconductor layers of the light emitting device 10. In some embodiments, when the light emitting device 10 is a blue light emitting device or a green light emitting device, a sapphire substrate or a GaN substrate may be used, and, when the light emitting device 10 is a red light emitting device, a GaAs substrate may be used.

Referring to FIG. 6B, a first mask layer 53 is formed on the substrate 51 to cover a plurality of light emitting devices 10. The first mask layer 53 may be formed to cover all of the plurality of light emitting devices 10, and may be formed to have a predetermined thickness on upper surfaces of the light emitting devices 10.

Subsequently, referring to FIG. 6C, a plurality of holes Hs are formed in the first mask layer 53. At least one hole H may be formed on each of the light emitting devices 10. According to the exemplary embodiment, three holes Hs are formed on each of the light emitting devices 10, and the three holes Hs are arranged asymmetrically to at least one direction where the light emitting devices 10 are arranged, as shown in FIG. 5C. Herein, the plurality of holes Hs in FIG. 6C are arranged asymmetrically to a direction which is perpendicular to the direction where the light emitting devices 10 are arranged.

The first mask layer 53 may be formed of a photosensitive material, and the plurality of holes Hs may be formed through a photolithography process. For example, the holes Hs may be formed through an exposure and development processes, but it is not limited thereto, but an etching process may be used. The plurality of holes Hs may be formed in a triangular shape.

Referring to FIG. 6D, a connection layer 55 is formed on the first mask layer 53. The connection layer 55 is formed on the first mask layer 53 while filling the plurality of holes Hs formed in the first mask layer 53. Since each of the plurality of holes Hs is formed over the light emitting device 10, the connection layer 55 may be connected to the light emitting devices 10 through at least one hole H formed over the light emitting device 10. A portion of the connection layer 55 may form a connection portion 55*a* by filling the at least one hole H formed over the light emitting device 10.

The connection layer 55 may be formed of an organic material such as poly dimethylpolysiloxane (PDMS), epoxy, acryl, color polyimide, or the like, but it is not limited thereto. Herein, the connection layer 55 may have a light transmittance of 90% or more, and a refractive index may be about 1.4 to about 1.7.

Referring to FIG. 6E, a first temporary substrate 57 is coupled to an upper region of the connection layer 55. The first temporary substrate 57 may be a polymer substrate such as PET, PEN, PI sheet, or the like, or may be a substrate such as glass, PC, PMMA, or the like. A film layer 61 and a buffer layer 63 may be disposed between the first temporary substrate 57 and the connection layer 55, respectively. For example, the film layer 61 may be disposed over the connection layer 55, the buffer layer 63 may be disposed over the film layer 61, and the first temporary substrate 57 may be disposed over the buffer layer 63. The buffer layer 63 may be formed of a material melted by heat or UV irradiation.

When the first temporary substrate 57 is coupled to the upper surface of the connection layer 55, bubbles generated in the connection layer 55 in a vacuum state may be removed, and a hardening process of the connection layer 55 may be performed at a temperature lower than a melting point of the first mask layer 53. In this process, the first temporary substrate 57 may be coupled to the connection layer 55.

Referring to FIG. 6F, the substrate 51 is removed from the light emitting devices 10. The substrate 51 may be removed by a laser lift-off process or a wet etching process. For example, in a case of a sapphire substrate, it may be removed by the laser lift-off process or a chemical lift-off process, and a GaAs substrate may be removed by the wet etching process.

Referring to FIG. 6G, the first mask layer 53 is removed from the light emitting devices 10 in a state that the substrate 51 is removed. The first mask layer 53 may be removed using, for example, acetone, a dedicated striper, dry etching, or the like. As such, the light emitting devices 10 are connected to the connection layer 55 through at least one connection portion **55*a* connected to each of the light emitting devices 10 and maintained as shown in FIG. 6**G.

Referring to FIG. 6H, the first temporary substrate 57 coupled to the upper surface of the connection layer 55 is removed. In some embodiments, the first temporary substrate 57 may be removed by heat or UV irradiation. The first temporary substrate 57 may be removed without damaging the film layer 61 because the buffer layer 63 is formed of a material melted by heat or UV irradiation.

Referring to FIG. 6I, a second temporary substrate 59 is coupled to a lower surface of the light emitting devices 10. The second temporary substrate 59 may be a rubber or UV sheet, or may be a polymer substrate such as PET, PEN, PI sheet, or the like, or a substrate such as glass, PC, PMMA, or the like.

When the second temporary substrate 59 is coupled to the light emitting devices 10, the light emitting devices 10 are removed from the connection layer 55 using the second temporary substrate 59 as shown in FIG. 6J. By applying an external force downward to the second temporary substrate 59 coupled to the light emitting devices, the at least one connection portion **55*a* connected to the light emitting devices 10 is cut, and the light emitting devices 10 are separated from the connection layer 55, as shown in FIG. 6**J.

The external force applied to the second temporary substrate 59 as shown in FIG. 6J, may be applied in a direction perpendicular to the connection layer 55 at one side of the second temporary substrate 59. As such, each of the light emitting devices 10 may be separated from the connection layer 55 in such a manner that the connection portions **55*a* connected to each of the light emitting devices 10** is sequentially cut.

Referring to FIG. 6K, the light emitting devices 10 separated from the connection layer 55 are disposed on the second temporary substrate 59 with a predetermined interval. At least one connection tip **55*b* may be formed on each of the light emitting devices 10 as a residue while the connection portion 55*a* is cut. The connection tip 55*b* is formed of the same material as the connection layer 55, and formed while the connection portion 55*a* is cut by an external force, so that thicknesses of the connection tips 55*b* may be different from one another. Also, the thicknesses of the connection tips 55*b* may be smaller than those of the first and second electrode pads 31 and 33 as shown in FIG. 6**K.

Referring to FIGS. 6K and 6L, a portion of the light emitting devices 10 disposed on the second temporary substrate 59 is transferred to another substrate using a picker 70. A substrate to be transferred may be a transparent substrate 121, but is not limited thereto. After the light emitting devices 10 are transferred onto the transparent substrate 121 in a unit of unit pixels 100, the transparent substrate 121 may be cut in the unit of the unit pixels 100 in some exemplary embodiments.

FIGS. 7A through 7K are schematic cross-sectional views illustrating a method of transferring light emitting devices according to another exemplary embodiment.

Referring to FIG. 7A, a light emitting device 10 is formed on a substrate 51. The substrate 51 is a substrate that grows semiconductor layers of the light emitting device 10, and may be a sapphire substrate, a GaN substrate, or a GaAs substrate. For example, the substrate 51 may be the sapphire substrate when the light emitting device 10 is a blue light emitting device or a green light emitting device, and may be a GaAs substrate when the light emitting device 10 is a red light emitting device.

Referring to FIG. 7B, a first mask layer 53 is formed on the substrate 51 to cover a plurality of light emitting devices 10. The first mask layer 53 may be formed to cover all of the plurality of light emitting devices 10, and may be formed to have a predetermined thickness on upper surfaces of the light emitting devices 10. The first mask layer 53 may be formed of, for example, a photosensitive material.

Referring to FIG. 7C, a first temporary substrate 57 is coupled onto the first mask layer 53. The first temporary substrate 57 may be a polymer substrate such as PET, PEN, PI sheet, or the like, or may be a substrate such as glass, PC, PMMA, or the like. A buffer layer 63 may be disposed between the first temporary substrate 57 and the first mask layer 53. The buffer layer 63 may be disposed on the first mask layer 53, and the first temporary substrate 57 may be disposed on the buffer layer 63.

Referring to FIG. 7D, the substrate 51 is removed from the light emitting devices 10. The substrate 51 may be removed using a laser lift-off process, a wet etching process, or the like. In a case that the substrate 51 is a sapphire substrate, the substrate 51 may be removed by the laser lift-off process or a chemical lift-off process. In a case that the substrate 51 is a GaAs substrate, the substrate 51 may be removed by the wet etching process.

Referring to FIG. 7E, a lower surface of the light emitting devices 10 and a lower surface of the first mask layer 53 may be exposed as the substrate 51 is removed. A second mask layer 65 is formed under the light emitting devices 10 and the first mask layer 53. The second mask layer 65 may cover the lower surface of the light emitting devices 10, and may have a thickness smaller than that of the first mask layer 53.

Referring to FIG. 7F, a plurality of holes Hs are formed in the second mask layer 65. At least one hole H may be formed under each of the light emitting devices 10. According to the exemplary embodiment, three holes Hs are formed under each of the light emitting devices 10, and the three holes Hs are arranged asymmetrically to at least one direction where the light emitting devices 10 are arranged. Herein, the three holes Hs in FIG. 7F are arranged asymmetrically to a direction which is perpendicular to the direction where the light emitting devices 10 are arranged.

The second mask layer 65 may be formed with a photosensitive material as the first mask layer 53, and the plurality of holes Hs may be formed by a photolithography process. The plurality of holes Hs may be formed to have a triangular shape as shown in the drawing.

Referring to FIG. 7G, a connection layer 55 is formed under the second mask layer 65. The connection layer 55 is formed under the second mask layer 65 while filling the plurality of holes Hs formed in the second mask layer 65. Since each of the plurality of holes Hs is formed under the light emitting device 10, the connection layer 55 may be connected to the light emitting devices 10 through the holes Hs formed under the light emitting devices 10. Connection portions 55*a* filling the holes Hs are formed together with the connection layer 55. The connection portions 55*a* may directly contact the first conductivity type semiconductor layer 23 (FIG. 2B).

The connection layer 55 may include an organic material such as poly dimethylpolysiloxane (PDMS), epoxy, acryl, color polyimide, or the like, but it is not limited thereto. Herein, the connection layer 55 may have a light transmittance of 90% or more, and a refractive index may be about 1.4 to about 1.7.

And a second temporary substrate 59 is coupled to a lower surface of the connection layer 55. The second temporary substrate 59 may be a polymer substrate the same as the first temporary substrate 57 such as PET, PEN, PI sheet, or the like, or may be a substrate such as glass, PC, PMMA, or the like.

Referring to FIG. 7H, the first temporary substrate 57 coupled to an upper surface of the connection layer 55 is removed. The first temporary substrate 57 may be removed by heat or UV irradiation. The first temporary substrate 57 may be removed from the first mask layer 53 because the buffer layer 63 is formed of a material melted by heat or UV irradiation.

Referring to FIG. 7I, the first mask layer 53 and the second mask layer 65 are removed from the light emitting devices 10. The first mask layer 53 and the second mask layer 65 may be removed using, for example, acetone, a dedicated striper, dry etching, or the like. As shown in FIG. 7I, the light emitting devices 10 are connected to the connection layer 55 by at least one connection portion 55*a* connected to each of the light emitting devices 10 and maintained.

Once the first and second mask layers 53 and 65 are removed, the light emitting devices 10 are disposed over the second temporary substrate 59 while being connected to the connection layer 55 and the connection portion 55*a* as shown in FIG. 7J. A portion of the light emitting devices 10 disposed over the second temporary substrate 59 may be transferred to another substrate using a picker 70.

Referring to FIG. 7K, each of the light emitting devices 10 picked up by the picker 70 is separated from the connection layer 55 as the connection portion 55*a* is snapped from the connection layer 55. The picker 70 picks up the light emitting devices 10 over the light emitting devices 10, and the connection portion 55*a* is disposed under the light emitting device 10. As such, at least one connection tip 55*b* may be formed under each of the light emitting devices 10.

Thereafter, the light emitting devices 10 picked up by the picker 70 may be transferred to the transparent substrate 121, and the transparent substrate 121 may be cut in a unit of individual unit pixel 100 to provide the unit pixels 100.

Referring back to FIG. 3B, the light emitting devices 10 are transferred to the transparent substrate 121 by the method of transferring the light emitting device described above. An adhesive layer 125 may be formed on the transparent substrate 121 in advance, and the light emitting devices 10 may be attached onto the transparent substrate 121 by the adhesive layer 125. Thereafter, a step adjustment layer 127 and connection layers 129*a*, 129*b*, 129*c*, and 129*d*, a protection layer 131, and bumps 133*a*, 133*b*, 133*c*, and 133*d* are formed, and then the transparent substrate 121 is cut off to manufacture the unit pixel 100 described with reference to FIG. 3A and FIG. 3B. A pixel module 1000 may be manufactured by arranging the unit pixels 100 on a circuit board 1001, and a displaying apparatus 10000 may be provided by arranging the pixel modules 1000 on a panel substrate 2100, as shown in FIGS. 1 and 3A.

FIG. 8 is a schematic cross-sectional view illustrating a unit pixel 100*a* according to one or more embodiments.

Referring to FIG. 8, the unit pixel 100*a* according to the illustrated exemplary embodiment is substantially similar to the unit pixel 100 described with reference to FIGS. 3A and 3B, but the bumps 133*a*, 133*b*, 133*c*, and 133*d* are omitted in the unit pixel 100*a*.

A protection layer 131 has openings 131*a* exposing connection layers 129*a*, 129*b*, 129*c*, and 129*d*. The openings 131*a* are disposed corresponding to the locations of the bumps 133*a*, 133*b*, 133*c*, and 133*d* of the unit pixel 100 described with reference to FIGS. 3A and 3B.

As the bumps are omitted, a thickness of the protection layer 131 in the illustrated exemplary embodiment is about ½ or less of a thickness of the protection layer 131 in the unit pixel 100, and, further, may be about ⅓ or less. For example, the thickness of the protection layer 131 in the unit pixel 100 may be about 45 μm, and, in the exemplary embodiment, the thickness of the protection layer 131 may be about 15 μm.

FIG. 9 is a schematic cross-sectional view illustrating a pixel module 1000*a* according to one or more embodiments. Herein, the pixel module 1000*a* on which the unit pixels 100*a* of FIG. 8 are mounted will be described.

Referring to FIG. 9, the pixel module 1000*a* according to the illustrated exemplary embodiment is generally similar to the pixel module 1000 described with reference to FIGS. 4A and 4B, but bonding material 1005 of the pixel module 1000*a* fills openings 131*a* of a protection layer 131 because the unit pixel 100*a* does not have bumps. The bonding material 1005 may completely fill the openings 131*a* of the protection layer 131, or may partially fill the openings 131*a* of the protection layer 131. When the bonding material 1005 partially fills the openings 131*a* of the protection layer 131, a cavity may be formed in the openings 131*a*.

A displaying apparatus 10000 may be provided by arranging a plurality of pixel modules 1000*a* on a panel substrate 2100.

FIG. 10 is a schematic cross-sectional view illustrating a unit pixel 100*b* according to one or more embodiments.

Referring to FIG. 10, the unit pixel 100*b* according to the exemplary embodiment is substantially similar to the unit pixel 100 described with reference to FIGS. 3A and 3B, but a concavo-convex pattern 121*p* is disposed corresponding to a window 123*a* of a light blocking layer 123 in the exemplary embodiment. More particularly, the concavo-convex pattern 121*p* may be disposed within or near a lower region of the window 123*a*. Accordingly, the light blocking layer 123 and an adhesive layer 125 may be formed on a substantially flat surface of a transparent substrate 121.

FIGS. 11A, 11B, 11C, 11D, 11E, and 11F are schematic plan views illustrating various types of windows.

First, referring to FIG. 11A, a light blocking layer 123 has windows 123*a* corresponding to light emitting devices 10*a*, 10*b*, and 10*c*. The light emitting devices 10*a*, 10*b*, and 10*c* may have a rectangular light emitting surface, and thus, the windows 123*a* may also be formed in a rectangular shape. The windows 123*a* are also spaced apart from one another corresponding to an interval between of the light emitting devices 10*a*, 10*b*, and 10*c*.

The light emitting devices 10*a*, 10*b*, and 10*c* are disposed corresponding to the windows 123*a* to emit light through the windows 123*a*. For example, centers of the light emitting devices 10*a*, 10*b*, and 10*c* may match centers of the windows 123*a*, respectively. Areas of the windows 123*a* may be larger than those of the light emitting devices 10*a*, 10*b*, and 10*c*, but the inventive concepts are not limited thereto, and the areas of the windows 123*a* may be smaller than those of the light emitting devices 10*a*, 10*b*, and 10*c*.

Referring to FIG. 11B, windows 123*b* further include extensions extending in the vertical direction from the windows 123*a* described above. The extensions extend in a direction perpendicular to a direction in which the light emitting devices 10*a*, 10*b*, and 10*c* are arranged. Viewing angles of light emitted from the light emitting devices 10*a*, 10*b*, and 10*c* may increase by the extensions in the direction perpendicular to the direction in which the light emitting devices 10*a*, 10*b*, and 10*c* are arranged.

For example, when the light emitting devices 10*a*, 10*b*, and 10*c* are disposed in a left-right direction of a direction in which an image is implemented, a color difference in the vertical direction may be reduced by increasing a viewing angle in the vertical direction. Similarly, when the light emitting devices 10*a*, 10*b*, and 10*c* are arranged in the left-right direction of the direction in which the image is implemented, a color difference in the lateral direction may be reduced by increasing a viewing angle in the lateral direction.

As shown in FIG. 11B, the extensions may have a rectangular shape in the extension direction. However, the inventive concepts are not limited thereto, and the extensions may have various shapes. For example, as shown in FIG. 11C, windows 123*c* may have extensions extending in the direction perpendicular to the arrangement direction of the light emitting devices from a central region in which the light emitting devices 10*a*, 10*b*, and 10*c* are arranged, and the extensions may have, for example, a fan shape. The viewing angle in the vertical direction may be increased using the shape of the extension, and luminance in a required direction may be increased.

Referring to FIG. 11D, windows 123*d* may have extensions in the diagonal direction. Diagonal extensions increase the viewing angles of light emitted from the light emitting devices 10*a*, 10*b*, and 10*c* in the diagonal direction.

Referring to FIG. 11E, windows 123*e* are disposed at a narrower interval than that of the windows 123*a* as shown in FIG. 11A. When the interval between the light emitting devices 10*a*, 10*b*, and 10*c* is narrow, the interval between the windows 123*e* may also be narrowed correspondingly. Color mixing performance may be improved by arranging the light emitting devices 10*a*, 10*b*, and 10*c* at a narrower interval.

Referring to FIG. 11F, a plurality of windows 123*f* may be disposed in respective regions corresponding to the light emitting devices 10*a*, 10*b*, and 10*c*. The windows 123*f* may have a rectangular shape, but the inventive concepts are not limited thereto, and may have various shapes such as a circle, a triangle, a square, or a combination thereof.

The windows 123*f* may be used to adjust an amount of light of the light emitting devices 10*a*, 10*b*, and 10*c*. In addition, when each of the light emitting devices 10*a*, 10*b*, and 10*c* has a plurality of light emitting cells, the windows 123*f* may be disposed corresponding to the plurality of light emitting cells.

Referring to FIG. 11G, windows 123*g* may have a circular shape, and may be arranged in a triangular shape. Shapes of the windows 123*g* are not limited to a circle, and may be, for example, a triangular shape. The windows 123*g* may be arranged in a triangular arrangement to improve directivity characteristics.

(Experimental Example)

FIG. 12 is a graph illustrating viewing angle characteristics of light according to a presence or absence of a concavo-convex pattern on a transparent substrate. Comparative Example and Inventive Example used in a simulation differ only in the presence or absence of the concavo-convex pattern on the transparent substrate 121.

More particularly, for the simulation, the transparent substrate 121 is a sapphire substrate having a refractive index of 1.77, and the light emitting device was set as a light emitting device having a peak wavelength of 467 nm. The light emitting device was set to have truncated roughness having a pitch of 4.0 μm, a bottom diameter of 4.0 μm, an upper diameter of 2.2 μm, and an elevation of 2.4 μm formed on a light emitting surface, and was set in a structure in which ITO and distributed Bragg reflectors were disposed on an opposite side of the light emitting surface of the light emitting device.

The light emitting device was set to be attached to the sapphire substrate by epoxy having a refractive index of 1.5, and a concavo-convex pattern of the sapphire substrate was set to have a pitch of 3 μm, a diameter of 2.8 μm, and an elevation of 1.8 μm. The refractive index of an epitaxial layer was set to be 2.5.

Referring to FIG. 12, the Comparative Example showed a high output in a direction perpendicular to the light emitting surface, and the output thereof tended to decrease as angles increased. In contrast, the Inventive Example showed a relatively high light output even in the direction perpendicular to the light emitting surface, but it was confirmed that the light output thereof was relatively high even in a range of about 10 to 20 degrees.

As such, it can be seen that the viewing angle of the display may be increased by setting the transparent substrate 121 to have the concavo-convex pattern on the surface facing the light emitting device.

Meanwhile, viewing angles of light emitted from red, green, and blue light emitting devices in a case when the transparent substrate 121 has no concavo-convex pattern thereon and viewing angles of light emitted from red, green, and blue light emitting devices in a case when the transparent substrate 121 has the concavo-convex pattern thereon are shown in Table 1.

TABLE 1

| | | R | | G | | B | |
|---|---|---|---|---|---|---|---|
| Comparative Example | Ave. viewing angle (°) | 122.38 | | 102.78 | | 100.98 | |
| | X, Y viewing angle (°) | 126.30 | 118.47 | 100.67 | 104.90 | 98.70 | 103.27 |
| Inventive Example | Ave. viewing angle (°) | 123.45 | | 116.35 | | 119.5 | |
| | X, Y viewing angle (°) | 124.4 | 122.5 | 113.4 | 119.3 | 118.1 | 120.6 |
| Increasement rate | | 101% | | 113% | | 118% | |

Referring to Table 1, in the case of the Comparative Example in which the transparent substrate 121 does not have the concavo-convex pattern, it can be seen that the viewing angle of light emitted from the red light emitting device is about 20 degrees greater than those of the light emitted from the green light emitting device and the blue light emitting device. This seems to occur because the roughness formed on the red, green, and red light emitting devices are different from one another. When a unit pixel using the above transparent substrate and light emitting devices is used, a large color difference will occur depending on an angle at which a user sees an image.

Meanwhile, in the case of the Inventive Example in which the transparent substrate 121 has the concavo-convex pattern, the viewing angles of light emitted from the green and blue light emitting devices are relatively largely increased compared to that of light emitted from the red light emitting device. Accordingly, by adding the concavo-convex pattern onto the transparent substrate 121, the viewing angles of light emitted from the unit pixel may be substantially uniform even when the red, green, and blue light emitting devices having different viewing angle characteristics are used.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

What is claimed is:

1. A unit pixel, comprising:
a transparent substrate;
a plurality of light emitting devices arranged on the transparent substrate and including a semiconductor layer;
an optical layer disposed between the light emitting devices and the transparent substrate and configured to transmit light emitted from the light emitting devices;
a reflector disposed on the transparent substrate and configured to reflect light emitted from the semiconductor layer;
a step adjustment layer covering a region of a light emitting device and comprising a region overlapping the optical layer; and
a light guide window disposed over the transparent substrate and configured to provide at least one light path,
wherein the transparent substrate has a concavo-convex pattern on a surface facing the light emitting devices,
wherein the semiconductor layer includes a region having a different width from a width of the light guide window, and
wherein the semiconductor layer is disposed between the reflector and the light guide window.

2. The unit pixel of claim 1, wherein the light emitting device further comprises a first electrode and a second electrode.

3. The unit pixel of claim 2, wherein the step adjustment layer comprises an open region exposing the first electrode.

4. The unit pixel of claim 1, wherein the step adjustment layer includes a region comprising a width smaller than a width of the optical layer.

5. The unit pixel of claim 1, wherein the step adjustment layer partially exposes an edge of the optical layer.

6. The unit pixel of claim 1, further comprising a cover layer covering a region of the transparent substrate and a region of the semiconductor layer.

7. The unit pixel of claim 6, wherein the cover layer covers a region of the optical layer.

8. The unit pixel of claim 1, wherein the light emitting device includes a plurality of light emitting cells.

9. A light module, comprising:
a circuit board; and
a unit pixel disposed on the circuit board,
wherein the unit pixel includes:
a transparent substrate;
a plurality of light emitting devices arranged on the transparent substrate and including a semiconductor layer;
an optical layer disposed between the light emitting devices and the transparent substrate and configured to transmit light emitted from the light emitting devices;
a reflector disposed on the transparent substrate and configured to reflect light emitted from the semiconductor layer;
a step adjustment layer covering a region of a light emitting device and comprising a region overlapping the optical layer; and
a light guide window disposed over the transparent substrate and configured to provide at least one light path,
wherein the transparent substrate has a concavo-convex pattern on a surface facing the light emitting devices,
wherein the semiconductor layer includes a region having a different width from a width of the light guide window, and
wherein the semiconductor layer is disposed between the reflector and the light guide window.

10. The light module of claim 9, wherein the light emitting device further comprises a first electrode and a second electrode.

11. The light module of claim 10, wherein the step adjustment layer comprises an open region exposing the first electrode.

12. The light module of claim 9, wherein the step adjustment layer includes a region comprising a width smaller than a width of the optical layer.

13. The light module of claim 9, wherein the step adjustment layer partially exposes an edge of the optical layer.

14. The light module of claim 9, further comprising a cover layer covering a region of the transparent substrate and a region of the semiconductor layer.

15. The light module of claim 14, wherein the cover layer covers a region of the optical layer.

16. The light module of claim 9, wherein the light emitting devices includes a plurality of light emitting cells.

17. A display apparatus, comprising:

a panel substrate; and a light module disposed on the panel substrate and comprising a unit pixel, wherein the unit pixel comprises:

a transparent substrate;

a plurality of light emitting devices arranged on the transparent substrate and including a semiconductor layer;

an optical layer disposed between the light emitting devices and the transparent substrate and configured to transmit light emitted from the light emitting devices;

a reflector disposed on the transparent substrate and configured to reflect light emitted from the semiconductor layer;

a step adjustment layer covering a region of a light emitting device and comprising a region overlapping the optical layer; and a light guide window disposed over the transparent substrate and configured to provide at least one light path, wherein the transparent substrate has a concavo-convex pattern on a surface facing the light emitting devices, wherein the semiconductor layer includes a region having a different width from a width of the light guide window, and wherein the semiconductor layer is disposed between the reflector and the light guide window.

18. The display apparatus of claim 17, wherein the light emitting devices further comprises a first electrode and a second electrode.

19. The display apparatus of claim 17, wherein the step adjustment layer includes a region comprising a width smaller than a width of the optical layer.

20. The display apparatus of claim 17, wherein the step adjustment layer partially exposes an edge of the optical layer.

* * * * *